United States Patent
Pupalaikis et al.

(10) Patent No.: US 7,050,918 B2
(45) Date of Patent: May 23, 2006

(54) DIGITAL GROUP DELAY COMPENSATOR

(75) Inventors: Peter J. Pupalaikis, Ramsey, NJ (US); Francois Lamarche, New Milford, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/678,374

(22) Filed: Oct. 3, 2003

(65) Prior Publication Data

US 2004/0162691 A1 Aug. 19, 2004

Related U.S. Application Data

(60) Provisional application No. 60/416,705, filed on Oct. 7, 2002.

(51) Int. Cl.
*H04H 1/04* (2006.01)

(52) U.S. Cl. .................... 702/106; 702/190; 370/200; 375/229; 708/300

(58) Field of Classification Search ............... 702/106, 702/190; 370/200, 205, 208, 210, 320, 335, 370/342, 343, 442, 463, 480, 485, 487, 488; 375/229, 298, 308, 340; 708/300, 301, 303, 708/304
See application file for complete search history.

(56) References Cited

U.S. PATENT DOCUMENTS

| | | | | |
|---|---|---|---|---|
| 5,125,100 | A * | 6/1992 | Katznelson | ................. 725/143 |
| 5,168,459 | A | 12/1992 | Hiller | |
| 5,381,359 | A | 1/1995 | Abbott et al. | |
| 5,420,514 | A | 5/1995 | Wardle et al. | |
| 5,808,574 | A | 9/1998 | Johnson et al. | |
| 6,438,367 | B1 * | 8/2002 | Crawford | ..................... 455/410 |
| 6,532,256 | B1 * | 3/2003 | Miller | ......................... 375/222 |
| 2002/0012389 | A1 * | 1/2002 | Wildhagen | ................... 375/229 |
| 2002/0159691 | A1 * | 10/2002 | Zenteno | ....................... 385/27 |
| 2002/0191299 | A1 * | 12/2002 | Jain | ............................ 359/637 |
| 2003/0028374 | A1 * | 2/2003 | Ribic | ......................... 704/233 |
| 2003/0053174 | A1 * | 3/2003 | Rosenfeldt | ................. 359/161 |
| 2003/0103723 | A1 * | 6/2003 | Bohn et al. | ................... 385/27 |
| 2003/0215028 | A1 * | 11/2003 | Hammes et al. | ............ 375/316 |

OTHER PUBLICATIONS

Ramachandran et al., "Generation of Digital Transfer Functions of the FIR Type Approximating", IEEE International Symposium, May 1990, vol. 4, pp. 3260-3262.

* cited by examiner

*Primary Examiner*—Carol S. W. Tsai
(74) *Attorney, Agent, or Firm*—Frommer Lawrence & Haug LLP; William S. Frommer

(57) ABSTRACT

A digital group delay compensation system comprising a digital allpass filter that is utilized in an implementation phase; and a system that generates coefficients for the allpass filter used in the implementation phase such that the overall performance of a system is measured and optimized in a calibration phase.

12 Claims, 13 Drawing Sheets

| 1 | for n=0 ...N | | | FOR EACH RESPONSE POINT |
|---|---|---|---|---|
| 2 | $R_n = GD_{comprel}(f_n, g_{i-1}) + gd_{spec_n}$ | | | CALCULATE A RESIDUAL |
| 3 | for j=0 ...2S-1 | | | FOR EACH COEFFICIENT |
| 4 | $J_{n,j} = \dfrac{\partial}{\partial (g_{i-1})_j} GD_{comprel}(f_n, g_{i-1})$ | | | CALCULATE AN ELEMENT OF THE JACOBIAN MATRIX |
| 5 | $H = J^T \cdot W \cdot J$ | | | CALCULATE THE APROXIMATE HESSIAN MATRIX |
| 6 | for j=0 ...2S-1 | | | GENERATE A MATRIX WHOSE DIAGONAL IS IDENTICAL TO THE HESSIAN MATRIX AND IS ZERO ELSWHERE |
| 7 | $D_{j,j} = H_{j,j}$ | | | |
| 8 | $\Delta P = (H + \lambda \cdot D)^{-1} \cdot J^T \cdot W \cdot R$ | | | CALCULATE THE CHANGE TO THE COEFFICIENT VALUES |
| 9 | $g_i = g_{i-1} - \Delta P$ | | | APPLY THE CHANGE TO THE COEFFICIENTS |
| 10 | $mse_i = \dfrac{1}{N+1} \cdot \sum_n (gd_{spec_n} + GD_{comprel}(f_n, g_{i-1}))^2$ | | | CALCULATE THE NEW MEAN SQUARED ERROR |
| 11 | true    $mse_i > mse_{i-1}$    false | | | DID THE MEAN SQUARED ERROR INCREASE ? |
| 12 | $\lambda = \lambda \cdot 10$ | FAVOR STEEPEST DECENT | $\lambda = \dfrac{\lambda}{10}$   FAVOR NETWONGAUSS CONVERGENCE | |

FIG. 9

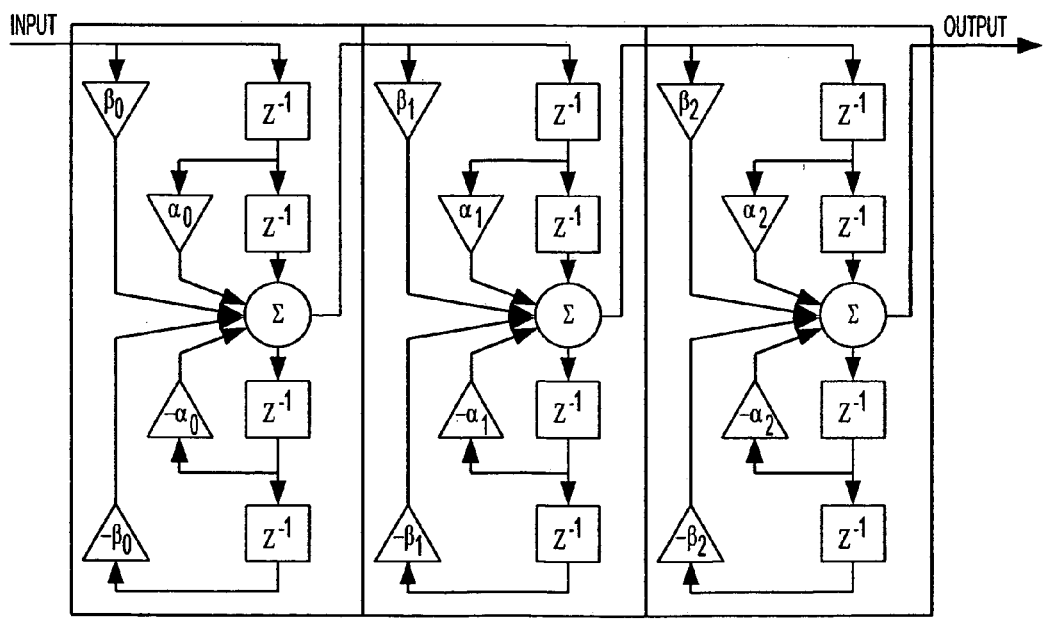

FIG. 10

DIGITAL GROUP DELAY COMPENSATOR

CROSS REFERENCE TO RELATED APPLICATIONS

This application claims the benefit of U.S. Provisional Patent Application 60/416,705, filed Oct. 7, 2002, the entire contents of which are incorporated herein by reference.

BACKGROUND OF THE INVENTION

This invention pertains generally to sampled-data systems: systems containing at least a subsystem consisting of an analog input signal, some analog hardware, an analog-to-digital converter (ADC), a processing element such as a digital signal processor (DSP) and a processed output signal in digital form.

This invention pertains specifically to such systems in which the phase characteristic is sub optimum. Phase is of particular interest because while magnitude response specifications can often be stated clearly, phase specifications often cannot. Magnitude response specifications are often made directly in the frequency domain. In other words, the specifications are a specific statement of desired magnitude response at particular frequencies. Filters designed to compensate magnitude response are most often specified, designed, and evaluated in the frequency domain. However, this is not necessarily the case for phase. Generally speaking, the requirement for phase response is that it be linear. This is because group delay, which is just another way of looking at phase, is defined as:

$$GD(\omega) = -\frac{d}{d\omega}\Phi(\omega) \quad \text{Equation 1}$$

where $\Phi$ is the phase. Group delay is the time delay that a frequency component experiences as it passes through a system. Linear, negative phase means that the group delay is a constant at all frequencies (i.e. the entire signal experiences only a time shift as it passes through the system). The statement of group delay and phase are essentially equivalent and both will be used interchangeably.

SUMMARY OF THE INVENTION

Although the achievement of constant group delay, or linear phase is the basic goal of a phase compensation system, the inventor of this application has determined that several problems can arise.

These problems are best illustrated with an example. FIG. 2 shows the step response of the LeCroy® WaveMaster® 8600A. (WM8600A or simply 8600A) Digital Sampling Oscilloscope (DSO). This DSO is a 6 GHz bandwidth, 20 GS/s scope (which at the time of this writing is the highest performance real-time DSO in the world). The step shown is the response of the DSO to a step applied using a Picoseconds Pulse Labs (PSPL) 1110-C pulser that provides risetimes of 32 ps. The magnitude response of the 8600A is a fourth order Bessel response out to the −3 dB point at 6 GHz. FIG. 2 shows a measurement of the overshoot, which is a tolerable 20% (in line with most high-end DSOs), but the measured risetime is 114 ps.

While inexact, for the purpose of these discussions, risetimes will be assumed to add in quadrature. This means that the following equation is obeyed:

$$t_{rise(measured)} = \sqrt{t_{rise(instrument)}^2 + t_{rise(applied)}^2} \quad \text{Equation 2}$$

Using Equation 2, the internal instrument risetime is calculated as 109 ps.

For systems with a magnitude response roll-off characteristic as the 8600A, theory predicts a bandwidth-risetime multiplier of 0.375–0.5 with an acceptable multiplier being about 0.45. This system has a multiplier of 0.654. Said differently, with the assumption of an 0.45 multiplier, the system has an internal risetime commensurate with a bandwidth of 4.1 GHz.

The group delay characteristics of the channel is measured and shown in FIG. 5, it can be seen that the group delay is not constant, but rather approximates a power curve that reaches 300 ps of delay at 6 GHz. The phase response, therefore, is extremely poor, and is thought to be the reason for the poor risetime performance.

To address this situation, this group delay is compensated through the use of an allpass filter. An allpass filter is designed to compensate for the group delay shown in FIG. 5. The result of this compensation is shown in FIG. 3. FIG. 3 shows troubling results. The risetime is very low and the overshoot is greatly reduced, but there is unwanted behavior preceding the step edge. The group delay compensation actually delays the edge by approximately 400 ps. The scope software accounts for this delay by shifting the waveform to maintain the proper trigger position. But to the scope user, it appears that the channel is acausal since the channel seems to react to the edge before it arrives. This behavior is called preshoot. It seems that group delay compensation is incorrect.

The entire frequency response has therefore been ideally compensated from the theoretical point of view, but the step response is not ideal. This is often the case in high-speed designs because of non-linear effects and other poorly understood hardware behavior, etc. The solution to this specific problem is to modify the allpass filter coefficients until the step response is good.

Now, assume for the moment that it is possible to design an allpass filter design that is capable of optimizing the response. For the example provided, this means that there is an allpass filter that optimizes the risetime without providing too much preshoot. The current state of the art dictates that such a filter would be designed by trial and error, randomly adjusting filter coefficients. The result of such a design might provide a result as shown in FIG. 4. FIG. 4 shows a response where the preshoot is a minor 1.4%. The overshoot is 13.4%, which is very good. The measured risetime is 80 ps, which translates to 73.3 ps internal risetime. The system has a bandwidth risetime multiplier of 0.44, which is adequate. It is yet undetermined how an allpass filter with this performance could be designed without selecting coefficients randomly.

This example illuminated several problems in the state of the art that the inventor of this application has determined need to be addressed:

1. In many systems, the best phase response that optimizes system performance is not clear.

2. Systems designed for different purposes have different criteria in the measurement of optimum performance.

3. Since allpass filters are designed in accordance with a desired group delay characteristic, it is unclear how to design such a filter if the desired group delay characteristic is unknown.

4. Group delay, the specification for an allpass filter design, is a frequency domain characteristic of a linear system. Systems containing (even slightly) nonlinear elements may exhibit poor correlation between frequency domain and time domain behavior.

5. System group delay characteristics may be bumpy (as in FIG. 5) which creates difficulty in providing an exact compensation. It is unclear how errors in the compensation manifest themselves in the time-domain performance.

This invention therefore involves the development and insertion of a digital signal processing (DSP) element (or digital filter) in the signal path of a sampled system, between the ADC and any other downstream processing of the digitized waveform.

This invention assumes that the channel being digitized already matches a prescribed magnitude response characteristic, either inherently or through the use of digital filters for magnitude compensation. The primary assumption is that the response characteristics of the channel are sub optimum due to non-ideal group delay, or phase response and that it is desirable to improve these characteristics.

It is the object of this invention to provide a system for group delay compensation which:

1. Provides optimum system performance, and therefore the best phase response, without the need to specify the phase response directly.
2. Provides a mechanism to specify optimum performance by directly stating the desired characteristics.
3. Allows tradeoffs between various response characteristics.
4. Utilizes allpass filters even when the desired group delay characteristic is unknown.
5. Is usable even in the presence of poorly understood or non-linear channel characteristics.
6. Is relatively insensitive to the exactness of the phase compensation to time-domain or other performance aspects.

Furthermore, it is the object to provide a group delay compensation system that:

1. Is capable of dealing with imperfect stimulus.
2. Is capable of dynamic compensation for changes in system configuration and channel characteristics such as different probing systems.
3. Provides reliable compensation with feedback to the user guaranteeing system performance.

BRIEF DESCRIPTION OF THE DRAWINGS

For a more complete understanding of the invention, reference is made to the following description and accompanying drawings, in which:

FIG. 9 is a Nassi-Schneiderman (NS) diagram describing the details of an iteration of the Levenberg-Marquardt algorithm used by the allpass filter fitter;

FIG. 10 shows the implementation of a three-section allpass filter;

DETAILED DESCRIPTION OF THE PREFERRED EMBODIMENTS

Figure 1:
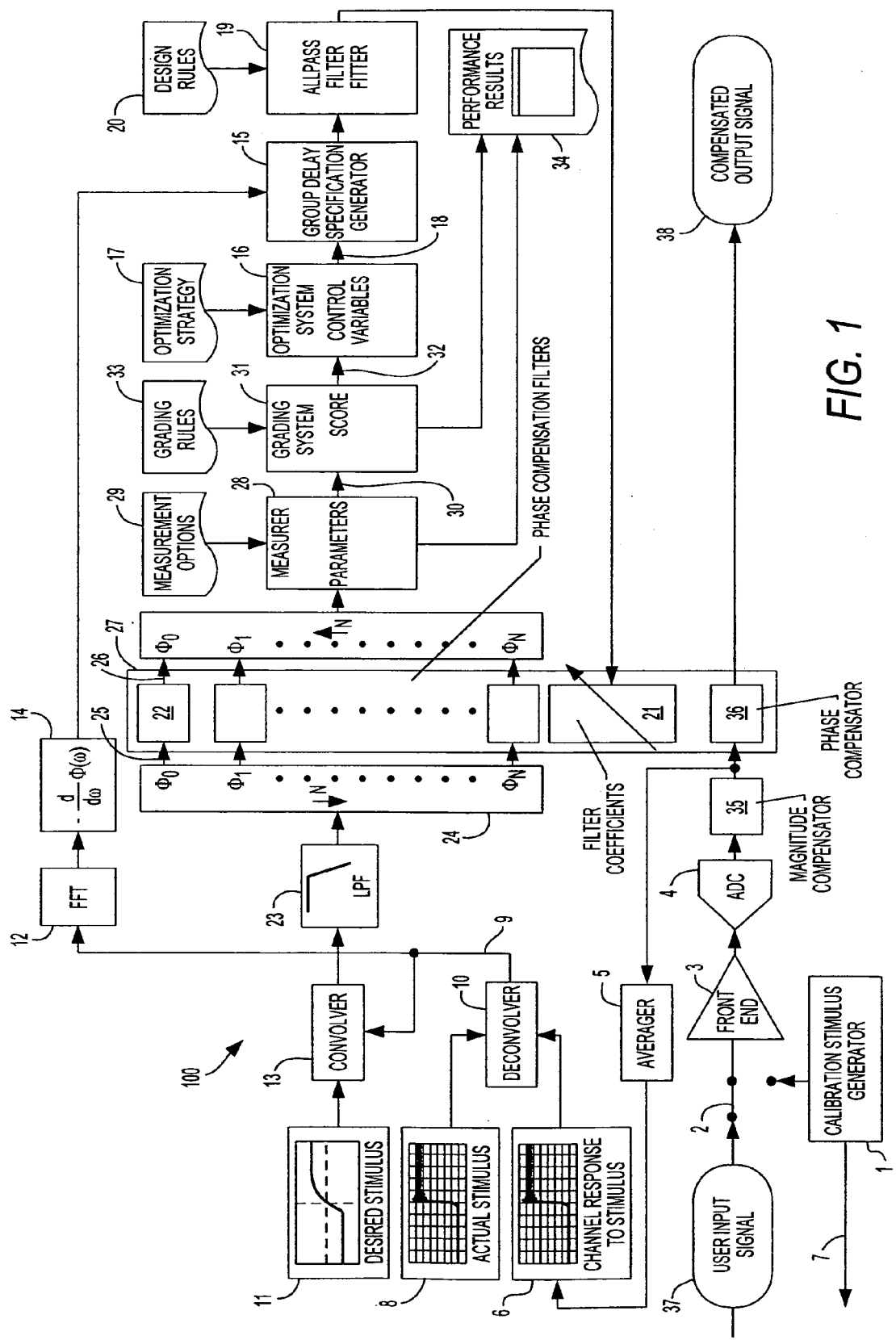
FIG. 1 is a block diagram of the group delay compensator of the invention.

FIG. 1 shows a block diagram of a group delay compensator system 100 that accomplishes these objectives.

As is shown in FIG. 1, a calibration stimulus generator 1 is provided. When the system is calibrated, calibration stimulus generator 1 is switched into a front-end amplifier 3 via a switch 2. Under this configuration, the stimulus from calibration stimulus generator 1 is acquired via the analog channel consisting of front-end amplifier 3, an ADC 4, into an optional memory (not shown) and on through a magnitude compensator 35, and averager 5. The stimulus is acquired and averaged repeatedly to form a high-sample rate, low noise rendering of the stimulus. The result is retained as a channel response to the stimulus 6. Alternatively, external hardware, such as a probe connected to the input, could be connected to the external output of the calibration stimulus generator 7 such that any acquisitions would include the characteristics of the external hardware in the channel response to stimulus 6.

Previously, the stimulus generated by calibration stimulus generator 1 was acquired and digitized by a high bandwidth, high accuracy instrument and stored as an actual stimulus 8. This forms the point of performance traceability. The accuracy of the entire calibration will depend on the accuracy of the actual stimulus 8, so it must have been acquired using highly precise methods.

A channel impulse response 9 is determined by deconvolving the channel response to the stimulus 6 with the actual stimulus 8 using a deconvolver 10.

The channel impulse response 9 is passed to 12 which calculates the frequency response of the channel and further to 14 which differentiates the phase with respect to frequency to form the group delay characteristic of the channel. This forms the input to group delay specifications generator 15.

Preceding 15 is the optimization system 16. 16 takes an optimization strategy provided by 17 and uses this strategy to generate a search. This begins with selecting control variables (or design rules) 18 that, when passed to 15 cause 15 to adjust the specification provided by 14. This is generally performed by adjusting some function approximation of the group delay characteristic, like a power curve approximation.

It shall be evident that the utilization of the channel group delay characteristic provided by 14 as an input to 15 is an efficient, but not essential aspect. The group delay specifications generator 15 could just as well generate group delay specifications independently of the actual group delay characteristics measured.

The group delay specification generated by 15 is passed to allpass filter fitter 19. 19 then calculates the coefficients of a digital all-pass filter meant to compensate the group delay provided by 15 utilizing design rules 20.

Allpass filter fitter 19 utilizes a nonlinear equation solver. This is a source of unreliability since there is no guarantee that a nonlinear equation solver will succeed. If, however, the state-space dictated by control variables 18 is bounded, then the possibility exists for precalculation (or at least pretesting) the effect of every possible control variable on the filter coefficients. In other words, the reliability of these areas can be guaranteed. The aforementioned usage of a function approximation to the measured group delay at the output of 14 has a shielding effect that improves reliability because filter fitter 19 does not have to deal with a bumpy characteristic to fit, but instead deals with a smooth curve with a bounded set of conditions. Fits to bumpy curves involve many local minima that can lead to convergence failure.

The coefficients generated by 19 are then loaded into the filter coefficient area 21 and into the bank of digital allpass filters depicted by 22. The reason that there is a bank of filters is because the sample rate of the filters being designed to compensate the channel will not necessarily be the same sample rate of the stimulus—in fact it is usually much less. Furthermore, the sample rate of the system being compensated, if lower than the sample rate of the stimulus, will not be sufficiently sampling the channel to provide accurate measurements of vital time-domain parameters with a single-shot acquisition.

Once coefficients 21 have been generated, the time-domain response characteristics can be evaluated.

This begins with the generation of an ideal stimulus 11. This stimulus is the stimulus for which we want the system optimized. 11 is convolved with the channel response 9 utilizing the convolver 13. The result is the channel response to the ideal stimulus 11. Note that this process overcame the difficulty of generating a perfect stimulus.

As mentioned previously, the sample rate of the filter system being designed will often be lower than the sample rate with which the desired stimulus was generated. For this reason, the result of convolver 13 is passed through a low-pass filter (LPF) 23 and downsampled by 24. LPF 23 is an anti-aliasing filter and is designed to ideally provide unity gain out to half the system sample rate and pass no signal thereafter.

Downsampler 24 downsamples by a factor N that is equal to the sample rate of the desired stimulus 11 divided by the sample rate of the system being compensated. If the factor N is not integer, then the output of LPF 23 is resampled to make it integer. Downsampler 24 is not simply a decimator, but rather it has N polyphase outputs depicted by 25. Each phase is fed through multiple, identical phase compensation filters under evaluation. Each filtered output is fed into the polyphase inputs 26 of upsampler 27. In this manner, the result of applying the desired stimulus 11 to the combination of the analog channel and the phase compensation filter defined by filter coefficients 21 is generated. This resulting waveform is then passed to the measurer 28. The measurer simply measures parameters of interest according to measurement options 29 and outputs them through its parameter output 30 to the grading system 31. The job of the grading system is to produce a grade or score 32, which is a function of the measured parameters 30. Grading system 31 applies grading rules 33, to generate a rating of performance. As a side effect, measurer 28 and grading system 31 produce a set of performance results 34 that can be output and viewed externally for performance verification.

Score 32 is passed to optimization system 16 and we have come full circle. Optimization system 16 now has the score of the phase compensation filter with respect to its output variables—in effect, it has a multi-dimensional coordinate in the state-space.

At this point optimization system 16, following optimization strategy 17, iterates, adapting its output variables such that the score 32 is maximized or the system performance results 34 are adequate. This forms a closed loop system such that when optimization system 16 has completed, filter coefficients 21 are those such that the performance is optimum and has the performance results given by 34.

Assuming the optimization system 16 and optimization strategy 17 are sufficient, the control variables 18 can be found such that the score 32 is maximized. Although this score maximization does not guarantee that the specifications are met, it does guarantee that the best possible performance tradeoffs have been made since the score itself is based on grading rules 33 supplied.

Observe that the maximization of the score did not depend on the absolute group delay characteristics of the resultant compensator, only on the ability of the compensator to maximize the performance aspects measured.

Observe also that this method of optimization has desensitized the system to errors in the actual group delay compensation. This feature is understood by realizing that the bottom line is that a particular set of control variables 18 produces a particular set of filter coefficients 21 that, when evaluated, results in a particular score 32. It is unknown and essentially unimportant why one set of control variables produces a better score than another.

Filter coefficients 21 are then loaded into the phase compensation filter for the channel (36) and in conjunction with the magnitude compensation filter 35 is used to filter user input signals 37 and provide compensated output signals 38.

This system is preferably utilized in a WM8600A DSO for the purpose of optimizing the risetime with a side benefit of improving the overshoot and an adverse side effect of introducing preshoot, but may be used in any appropriate digital storage oscilloscope. The application of obvious modifications to this specific implementation to suit other applications shall be considered embodiments of this invention.

The WM8600A, for example, contains four channels operating over a gain range of 10 mV/vertical division (10 mV/div) to 1 V/div. Typically, it operates in fixed steps of 10, 20, 50, 100, 200, 500 and 1000 mV/div. Each channel has a different phase characteristic as a function of V/div setting.

Furthermore, internal to the instrument, there is an additional four possible settings of the front-end amplifier. The description of these settings is beyond the scope of this document, but it is sufficient to note that these four settings also affect the phase.

The combination of channels, V/div ranges, and front-end amplifier settings produces a total of 112 different phase characteristics for the instrument.

Figure 6:
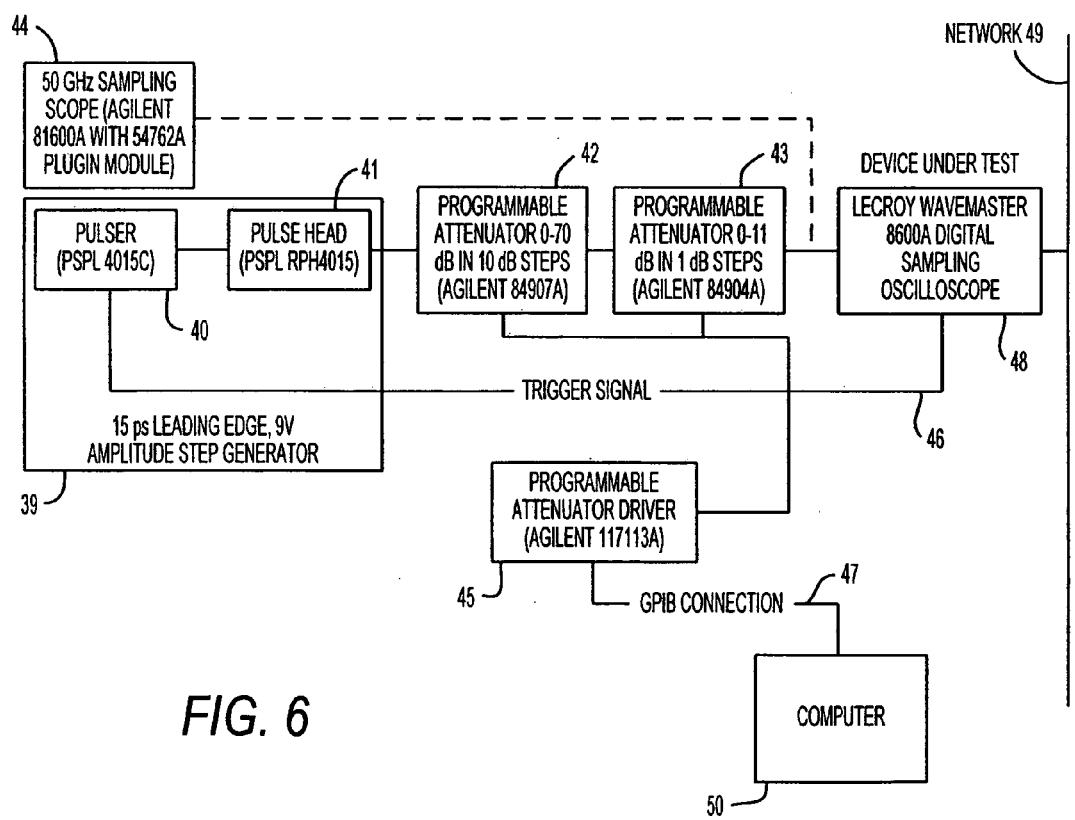
FIG. 6 is a block diagram showing the calibration equipment and their arrangement for the calibration of the group delay compensation system in a WM8600A.

All of the settings that produce these various characteristics are calibrated at the factory in the arrangement shown in FIG. 6. The channel of the 8600A 48 is connected to the output of the attenuator 43. The step generator 39 consisting of a pulser 40 and pulse head 41 delivers an edge through the attenuators 42 and 43 into the channel of the 8600A 48.

While the input edge is 15 ps, the output of the attenuators is a much slower, degraded step. The major contributor to the degradation is skin-effect.

The trigger input is connected via a cable 46 to the trigger output of the step generator 39. 8600A 48 is also connected to a local area network 49. During calibration, the 8600A 48 accepts remote commands via the network 49 from a computer 50 also connected to the network 49. Computer 50 commands the 8600A 48 to assume a specified V/div and front-end amplifier configuration under test. Computer 50 then directs a programmable attenuator driver 45 over a General Purpose Instrument Bus (GPIB) connection 51, specifying the proper amount of attenuation from the programmable attenuators 42 and 43 such that the 9V signal from the step generator 39, occupies 80% of the vertical screen when acquired by the 8600A 48. 8600A 48 is then directed by the computer 50 to adjust its offset to center the signal, and to adjust its time/horizontal division (T/div), trigger threshold and trigger delay such that the leading edge of the step appears centered horizontally in a window of 5 ns duration. Averaging is turned on in the 8600A. 1000 waveforms are acquired and averaged, resulting in a 1000 point equivalent time waveform with a 200 GS/s sample rate, which is then uploaded to computer 50 over the network 49.

Computer 50, running a calibration program consistent with the intent of this invention, deconvolves this acquisition with a result obtained previously by acquiring the signal generated under these exact conditions with the sampling scope 44 to generate the channel impulse response. Then, it convolves this with a prescribed ideal step internally generated to simulate a second order, critically damped (Q=0.5) system with a risetime of 50 ps to generate the channel response to the desired stimulus. This result is passed back via the network 49 to the 8600A 48 where it stores this result on its hard-disk for later use.

The deconvolution-convolution step accounts for the degraded step that arrives at the output of 43.

This operation is repeated for all 112 combinations and the 8600A 48 is removed from the calibration setup.

When the 8600A is operated at a particular front-end amplifier output configuration at a particular V/div setting at a particular sample rate on a given channel, it must complete the calibration by building a group delay compensation filter. In practice, this operation is performed at the factory in a self-test arrangement. The 8600A utilizes a filter caching arrangement that allows these compensation filters to be built once and stored on the hard disk. The control of the filter cache is shown in the dialog in FIG. 7 in the cache control area 52 where filter reads 53, writes 54 and overwrite 55 enables are specified. Generally, these are set to read and write, as shown, so that filters are read from the disk if they exist and written to the disk after a build if they did not exist.

For the purpose of this explanation, assume that a filter does not exist and needs to be built at a particular setting. To begin the build, the appropriate channel response to the desired stimulus is read from the hard disk. The derivative is calculated followed by the application of a Kaiser-Bessel window with a value for alpha as specified in 65. The Kaiser-Bessel window is well known. Then, the Chirp-Z Transform (CZT) is calculated such that the result is a set of N+1 equally spaced points (where N is specified by 57) between 0 Hz and the maximum frequency of compensation specified by 58. The CZT is utilized because it can provide an arbitrary number of points in an arbitrary frequency range. In addition, only a power of two FFT is needed internally. The CZT is well known. The phase is then calculated and unwrapped utilizing a maximum phase change specified in 59, and the group delay is calculated utilizing Equation 1. All of these calculations are well known.

This calculation results in the measured channel group delay characteristic described as a coordinate vector containing N+1 elements such that each coordinate: $(f[n], gd_{meas}[n])$ describes the measured group delay with respect to frequency, where n is an integer such that $n \in [0,N]$.

If a magnitude compensator (or any other digital filter is also in use), its group delay must be accounted for. This is done by plotting the group delay of the magnitude compensation filter at the frequency points f[n] and adding this delay point by point to the group delay of the channel calculated. Furthermore, as will be explained shortly, the magnitude compensation filters appear in cascade with the allpass filter under evaluation. By adding the group delay of the magnitude compensator to the calculated group delay of the uncompensated system and by cascading the magnitude compensator with the allpass filter under evaluation, the proper effect is achieved.

Now that the proper stimulus has been generated and the group delay characteristic has been measured, we turn our attention to the optimizer element.

As mentioned previously, it is the job of the optimizer element to optimize the performance of the channel. This is performed by specifying output control variables and reading the score at its input. In this sense, it is a closed loop system.

Before discussing the details of optimization, the closed loop circuit will be explained. In other words, the operation from the specification of a set of control variables at the optimizer output around the path back to the score input, without regard for the strategy of selecting these output control variables will be described. Once this has been explained, the optimization strategy will be discussed in detail.

In the 8600A, the optimizer specifies two output control variables called power and vernier. These values are provided to the compensation specification generator.

The compensation specification generator first fits the measured group delay characteristic of the uncompensated system to the following equation:

$$GD_{approx}(f) = A \cdot f^P \qquad \text{Equation 3}$$

Where f is frequency, P is the power provided by the optimizer, and A is a value that minimizes the mean-squared error between the measured group delay characteristic of the uncompensated channel and the evaluation of Equation 3. In other words, A is chosen such that the following equation is minimized:

$$\frac{1}{N} \cdot \sum_n (gd_{meas_n} - A \cdot f_n^P)^2 \qquad \text{Equation 4}$$

The value of A that accomplishes this is:

$$A = \frac{\sum_n f_n^P \cdot gd_{meas_n}}{\sum_n f_n^{2 \cdot P}} \qquad \text{Equation 5}$$

The group delay specification is calculated by generating another N+1 element coordinate vector (f[n],gd$_{spec}$[n]) using the following equation:

$$gd_{spec_n} = A \cdot f_n^P \cdot V \qquad \text{Equation 6}$$

where V is the vernier value provided by the optimizer. Thus, the group delay specification is a modified approximation of the actual group delay characteristics of the channel. The group delay specification is then passed to the allpass filter fitter. The allpass filter fitter utilizes design rules 51 read from a file and configurable through a dialog shown in FIG. 7, the group delay specification provided and an equation solver to resolve allpass filter coefficients that compensate for the group delay specification provided.

The allpass filter is an infinite impulse response (IIR) filter consisting of multiple, cascaded biquad sections. The number of sections is specified by the degree of compensation 61. Generally speaking, a higher degree of compensation results in a larger filter that takes longer to execute but provides tighter compliance to the specification.

An analog allpass filter section looks like this:

$$H(s) = \frac{s^2 - \frac{\omega 0}{Q} \cdot s + \omega 0^2}{s^2 + \frac{\omega 0}{Q} \cdot s + \omega 0^2} \qquad \text{Equation 7}$$

where $\omega 0$ is the center frequency (in rad/s) and Q is the quality factor. Provided the system is underdamped (Q>0.5), this filter section has a pair of poles that are complex conjugates. One pole is located at:

$$\sigma = -\frac{\omega 0}{2 \cdot Q} + j \cdot \frac{\omega 0}{2 \cdot Q} \cdot \sqrt{4 \cdot Q^2 - 1} \qquad \text{Equation 8}$$

The other is located at Re($\sigma$)–j·Im($\sigma$). Similarly, it has two zeros that are complex conjugates. One zero is located at –Re($\sigma$)+j·Im($\sigma$) and the other at –Re($\sigma$)–j·Im($\sigma$).

This filter affects the group delay (and phase) but does not affect the magnitude response.

The maximum group delay of such a filter stage occurs at:

$$\omega_m = \omega 0 \cdot \sqrt{\sqrt{4 - \frac{1}{Q^2}} - 1} \qquad \text{Equation 9}$$

Which is always less than $\omega 0$, but approximately equal to $\omega 0$ for high Q values.

The maximum group delay provided at $\omega_m$ is:

$$T_{max} = \frac{4 \cdot Q}{\omega 0} \qquad \text{Equation 10}$$

A digital allpass filter is created by utilizing the matched z-transform. The matched z-transform involves a simple substitution for pole and zero locations:

$$\zeta = e^{\frac{\sigma}{Fs}} \qquad \text{Equation 11}$$

Where Fs is the sample rate.

This substitution leads to the following transfer function:

$$H(z) = \frac{\left(z - \frac{1}{\zeta}\right) \cdot \left(z - \frac{1}{\overline{\zeta}}\right)}{\left(1 - \frac{1}{\zeta}\right) \cdot \left(1 - \frac{1}{\overline{\zeta}}\right)} \cdot \frac{(1 - \zeta) \cdot (1 - \overline{\zeta})}{(z - \zeta) \cdot (z - \overline{\zeta})} \qquad \text{Equation 12}$$

Where the transfer function has been normalized for unity gain.

Equation 12 can be rearranged in the form:

$$H(z) = \frac{\beta + \alpha \cdot z^{-1} + z^{-2}}{1 + \alpha \cdot z^{-1} + \beta \cdot z^{-2}} \qquad \text{Equation 13}$$

Where:

$$\beta = (|\zeta|)^2 \quad \alpha = -2 \cdot Re(\zeta) \qquad \text{Equation 14}$$

The goal of the allpass filter fitter is to generate coefficients $\alpha$ and $\beta$ for each section of the filter such that the group delay specification is compensated. This means that the group delay of the allpass filter added to the group delay specification should equal a constant value (where this constant value is the absolute delay provided by the filter as an unavoidable side effect).

The group delay of a filter section in Equation 13 is:

$$D\left(x = \cos\left(2 \cdot \pi \cdot \frac{f}{Fs}\right)\right) = \qquad \text{Equation 15}$$

$$\frac{-2}{Fs} \cdot \frac{(-\alpha + \alpha \cdot \beta) \cdot x + (\beta^2 - 1)}{(4 \cdot \beta) \cdot x^2 + (2 \cdot \alpha \cdot \beta + 2 \cdot \alpha) \cdot x + (1 + \alpha^2 - 2 \cdot \beta + \beta^2)}$$

For a filter containing S sections, the total group delay provided is:

$$GD_{comp}(f) = \sum_s D\left(\cos\left(2\cdot\pi\cdot\frac{f}{Fs}\right), \alpha_s, \beta_s\right) \qquad \text{Equation 16}$$

where $s \in [0,S)$.

The goal of the filter fitter can be clarified to calculate the coefficients $\alpha$ and $\beta$ for each section such that the following equation is minimized:

$$mse = \frac{1}{N+1} \cdot \sum_n \left(gd_{spec_n} + GD_{comp}(f_n) - D_{const}\right)^2 \qquad \text{Equation 17}$$

Since $D_{const}$ is arbitrary, the zero frequency group delay of the filter can be utilized, and the situation simplified:

$$mse = \frac{1}{N+1} \cdot \sum_n \left(gd_{spec_n} + GD_{comprel}(f)\right)^2 \qquad \text{Equation 18}$$

Where:

$$GD_{comprel}(f) = GD_{comp}(f_n) - GD_{comp}(0) \qquad \text{Equation 19}$$

In order to minimize Equation 18, the point at which the gradient is zero is determined. In other words, a (local) minimum is reached when values of the filter coefficients $\alpha_s$ and $\beta_s$ are found for all s such that the partial derivative of the mean-squared error with respect to all coefficients are zero when the filter group delay is evaluated at these coefficient values.

This means that the partial derivative with respect to any coefficient is described to be zero:

$$\frac{\partial}{\partial \alpha_s} mse = 0 \text{ and } \frac{\partial}{\partial b_s} mse = 0$$

for all s. The evaluation of these partials leads to:

$$\frac{\partial}{\partial \alpha_s} mse = \frac{2}{N+1} \cdot \qquad \text{Equation 20}$$

$$\sum_n \left(GD_{comprel}(f_n) + gd_{spec_n}\right) \cdot \frac{\partial}{\partial \alpha_s} GD_{comprel}(f_n) \text{ And}$$

$$\frac{\partial}{\partial \beta_s} mse = \qquad \text{Equation 21}$$

$$\frac{2}{N+1} \cdot \sum_n \left(GD_{comprel}(f_n) + gd_{spec_n}\right) \cdot \frac{\partial}{\partial \beta_s} GD_{comprel}(f_n)$$

Equation 20 and Equation 21 demonstrate that to evaluate the partial derivatives of the mean-squared error, analytical functions for the group delay and the partial derivatives of the group delay with respect to the coefficients are required.

The partial derivative of the relative group delay with respect to each coefficient is:

$$\frac{\partial}{\partial \alpha_s} GD_{comprel}(f) = \frac{\partial}{\partial \alpha_s} GD_{comp}(f) - \frac{\partial}{\partial \alpha_s} GD_{comp}(0) \qquad \text{Equation 22}$$

And $$\frac{\partial}{\partial \beta_s} GD_{comprel}(f) = \frac{\partial}{\partial \beta_s} GD_{comp}(f) - \frac{\partial}{\partial \beta_s} GD_{comp}(0) \qquad \text{Equation 23}$$

Where:

$$\frac{\partial}{\partial \alpha_s} GD_{comp}\left(x = \cos\left(2\cdot\pi\cdot\frac{f}{Fs}\right)\right) = \qquad \text{Equation 24}$$

$$-\frac{2}{Fs} \cdot \frac{\begin{bmatrix} (-4\cdot\beta_s + 4\cdot\beta_s^2)\cdot x^3 + \\ (\alpha_s + 5\cdot\beta_s - 5\cdot\beta_s^2 + 1 - \beta_s\cdot\alpha_s^2 - \beta_s^3)\cdot x + \\ (2\cdot\alpha_s - 2\cdot\beta_s^2\cdot\alpha_s) \end{bmatrix}}{\begin{bmatrix} (4\cdot\beta_s)\cdot x^2 + \\ (2\cdot\alpha_s\cdot\beta_s + 2\cdot\alpha_s)\cdot x + \\ (\alpha_s^2 - 2\cdot\beta_s + \beta_s^2 + 1) \end{bmatrix}^2}$$

$$\frac{\partial}{\partial \beta_s} GD_{comp}\left(x = \cos\left(2\cdot\pi\cdot\frac{f}{Fs}\right)\right) = \qquad \text{Equation 25}$$

$$-\frac{2}{Fs} \cdot \frac{\begin{bmatrix} (4\cdot\alpha_s)\cdot x^3 + \\ (4\cdot\beta_s^2 + 4\cdot\alpha_s^2 + 4)\cdot x^2 + \\ (\alpha_s\cdot\alpha_s\cdot\beta_s^2 + \alpha_s^3 + 6\cdot\alpha_s\cdot\beta_s)\cdot x + \\ (-2\cdot\beta_s^2 + 4\cdot\beta_s + 2\cdot\beta_s\cdot\alpha_s^2 - 2) \end{bmatrix}}{\begin{bmatrix} (4\cdot\beta_s)\cdot x^2 + \\ (2\cdot\alpha_s\cdot\beta_s + 2\cdot\alpha_s)\cdot x + \\ (\alpha_s^2 - 2\cdot\beta_s + \beta_s^2 + 1) \end{bmatrix}^2}$$

At this point, knowing Equation 19, Equation 22 and Equation 23, one could solve the filter adequately with any reasonable non-linear equation solver, such as the genfit function within MathCAD. In actuality the solver utilizes the Levenberg-Marquardt algorithm.

A requirement is a reasonable guess at the values of $\alpha_s$ and $\beta_s$. These can be arrived at empirically by finding reasonable values that cause the fit to succeed and then statistically analyzing typical resulting values calculated for $\alpha_s$ and $\beta_s$.

One can use a bit more insight provided by the analog allpass filter described by Equation 7 and use the following recipe: First, a maximum delay 64, the maximum frequency for compensation 58 and the number of sections 61 is specified. The max delay for a section is calculated by dividing the sections 61 into the maximum delay 64. The values of the center frequency for each stage is set using the following equation:

$$f0_s = \left(3 + (f_{maxcomp} - 3)\cdot\frac{s}{S}\right) \qquad \text{Equation 26}$$

$$\omega 0_s = 2\cdot\pi\cdot f0_s$$

Figure 7:
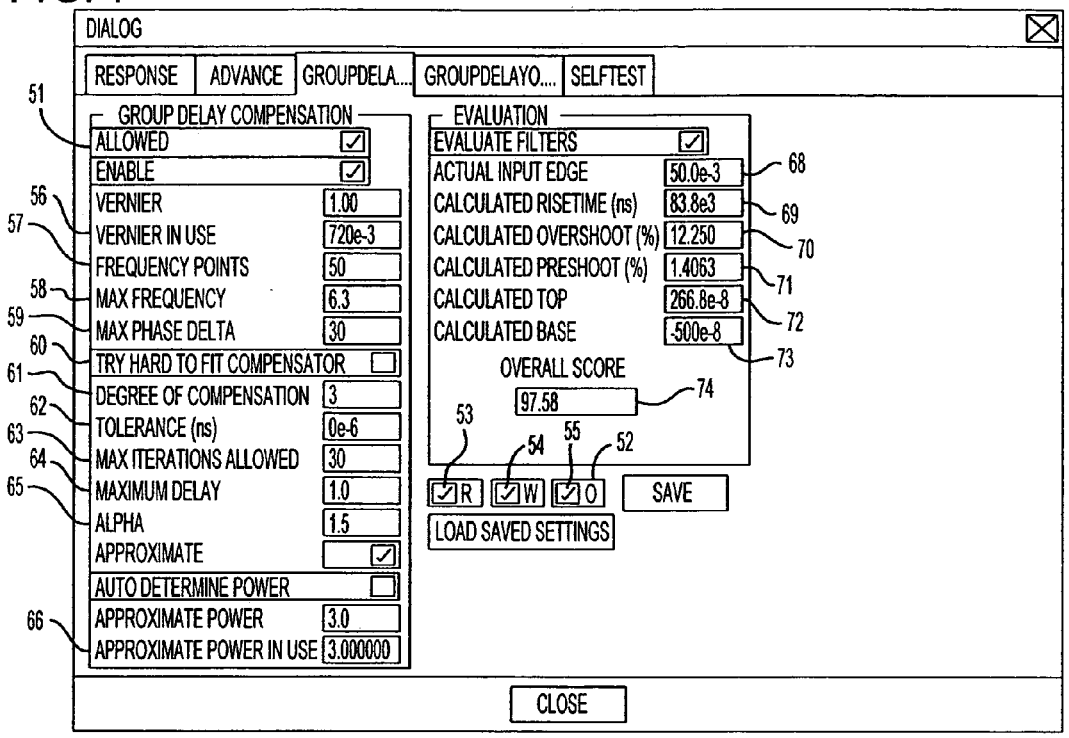
FIG. 7 and FIG. 8 show dialog pages within the WM8600A that are used for the configuration of group delay measurement, allpass filter fitting, evaluation, performance measurement, grading and optimization.

This leads to values of f0 of 3, 4.1 and 5.2 GHz for the specifications shown in FIG. 7. Then, the Q of each stage is calculated using Equation 10 and the max delay for a section allocated:

$$Q_s = \frac{\omega 0_s \cdot \frac{delay_{max}}{S}}{4} \qquad \text{Equation 27}$$

This leads to Q values of 1.57, 2.14, and 2.72 and constant "bandwidth" for each section of about 2 GHz.

Before continuing, it is useful to note that the max delay per section was calculated assuming that each stage contributes equally to the max delay. This is reasonable since the low Q that leads to a high bandwidth means that the effect of each filter stage is felt over quite a large frequency range.

The Q and ω0 values are then used in Equation 8 to determine the s-domain pole location. This pole is used in Equation 11 to determine the z-domain pole location. This pole is used in Equation 14 to determine starting values for $\alpha_s$ and $\beta_s$.

While any calculations utilizing the analog filter equations will not precisely match the characteristics of the digital filter, the requirement is that the starting values of $\alpha_s$ and $\beta_s$ are reasonably close—the nonlinear equation solver takes over from there.

Knowing the filter group delay function and the partial derivatives, along with an initial guess at the starting filter coefficients, the Levenberg-Marquardt algorithm is run repeatedly. On each iteration, the coefficients are adjusted to reduce the mean-squared error. Levenberg-Marquardt is a balance between two common least-squares minimization methods: the method of steepest decent, in which the small steps are made along the gradient vector of the mean-squared error at each iteration. The method of steepest decent is very slow, but guaranteed to converge to a local minimum. The other method is Newton-Gauss. Newton-Gauss convergence is very fast but can also diverge. Levenberg-Marquardt measures its own performance on each iteration. Successful iterations cause it to favor Newton-Gauss on subsequent iterations. Failed iterations cause it to favor steepest-decent on subsequent iterations. The method it is favoring depends on a value (λ).

FIG. 9 is an NS diagram showing one iteration of the Levenberg-Marquardt algorithm. FIG. 9 makes the following assumptions: g is a vector of coefficient vectors such that:

$$(g_i)_{2 \cdot s} = \alpha_s$$

$$(g_i)_{2 \cdot s+1} = \beta_s \qquad \text{Equation 28}$$

Where i represents the iteration number.

$g_0$ is a vector containing the initial guess $mse_0$ is the initial mean-squared error calculated using Equation 18 with the initial guess values.

In steps 5 and 8, W is the identity matrix (since no weighting is used).

λ is initialized arbitrarily to 1000.

Note that at step 8, a matrix inverse must be calculated. There are textbook algorithms for this or one could use other software available in the public domain such as LAPACK or TNT.

A variation to the algorithm is applied in that an iteration is never without either reducing mse, or meeting some convergence criteria, as will be described below. This means if step 11 detects that the mean squared error was not improved, the change is made to λ, $g_i$ is replaced with $g_{i-1}$, and a loop back to step 8 is made. This is actually more economical because it avoids recalculation of the residual, Jacobian, and approximate Hessian matrices.

Several methods are used to stop iteration:
1. If the specification on mse is reached. The mse specification is supplied by the tolerance 62 (which is specified customarily as root-mean-square (rms)error in ns). Generally, this is not depended on and the mse specification is kept very low. This is because if the system reaches a low mse, it may hit the local minimum only a few iterations later. Generally, the few extra iterations are desired for even better error minimization. You can see that the default specification used for tolerance 62 is 0.
2. If λ reaches a maximum value (1e–10). Sometimes, this indicates divergence, but this situation sometimes occurs at the convergence point if convergence went undetected. The bottom line is that for huge values of lambda, further convergence will be extremely slow on subsequent iterations, so even if it hasn't converged, the iterations should stop and a new strategy should be attempted.
3. If λ reaches a minimum value (1e–10)—at this value of λ, the system is known to have converged well.
4. At the convergence point, λ may oscillate between two or three values forever. This occurrence is detected by first applying the log of λ to a simple digital filter with a time constant of 5 samples. The absolute value of the difference between the log of λ and the output of this simple filter is then taken. If, after five iterations, it drops below 2.5, iterating is stopped.
5. At the convergence point, mse will be changing very slowly. This is detected by applying the log of mse to a simple digital filter with a time constant of 5 samples. The absolute value of the difference between the log of mse and the output of this simple filter is then taken. If, after five iterations, it drops below 2.5, then iterating is stopped. The use of the log of mse is justified by the fact that Newton-Gauss exhibits quadratic convergence.
6. If the maximum number of iterations allowed has been exceeded. The maximum number of iterations is supplied by 63. Normally, one of the other conditions mentioned occurs long before this point. A maximum on the number of iterations is placed as a safety net to prevent iterating indefinitely. 30 is a good value.

Once the local minimum has been reached, examination of the mean-squared error tests the performance of the minimization. If it is not low enough, the coefficients are randomly agitated to shake the system out of the local minimum and iteration continues with the hopes of converging on the absolute minimum. This is often unnecessary when the estimation of the group delay characteristic provided is a monotonic curve that does not provide troublesome local minima. The option to use this random coefficient agitation is controlled by 60.

The fit usually converges in about ten iterations. Upon completion of the fit, the allpass filter coefficients are unloaded from the g vector using Equation 28 and an allpass filter implementation is constructed. The filter consists of cascaded difference equation implementations of Equation 13:

$$y_{s,k} = \beta_s \cdot \chi_{s,k} + \alpha_s \cdot \chi_{s,k-1} + x_{s,k-1} + \chi_{s,k-2}$$

$$-\alpha_s \cdot y_{s,k-1} - \beta_s \cdot y_{s,k-2} \qquad \text{Equation 29}$$

Where y[S–1][k] is the $k^{th}$ output of the filter and x[s][k] is y[s–1][k] except when zero in which x[0][k] is the $k^{th}$ input point to the filter. This situation is described pictorially in FIG. 10. FIG. 10 shows a three section (sixth order) digital allpass filter with the understanding that higher order filters are generated simply by cascading more filter sections.

At this point, an allpass filter has been generated that is a function of the power and vernier values specified along with the group delay characteristics of the channel.

Figure 11:
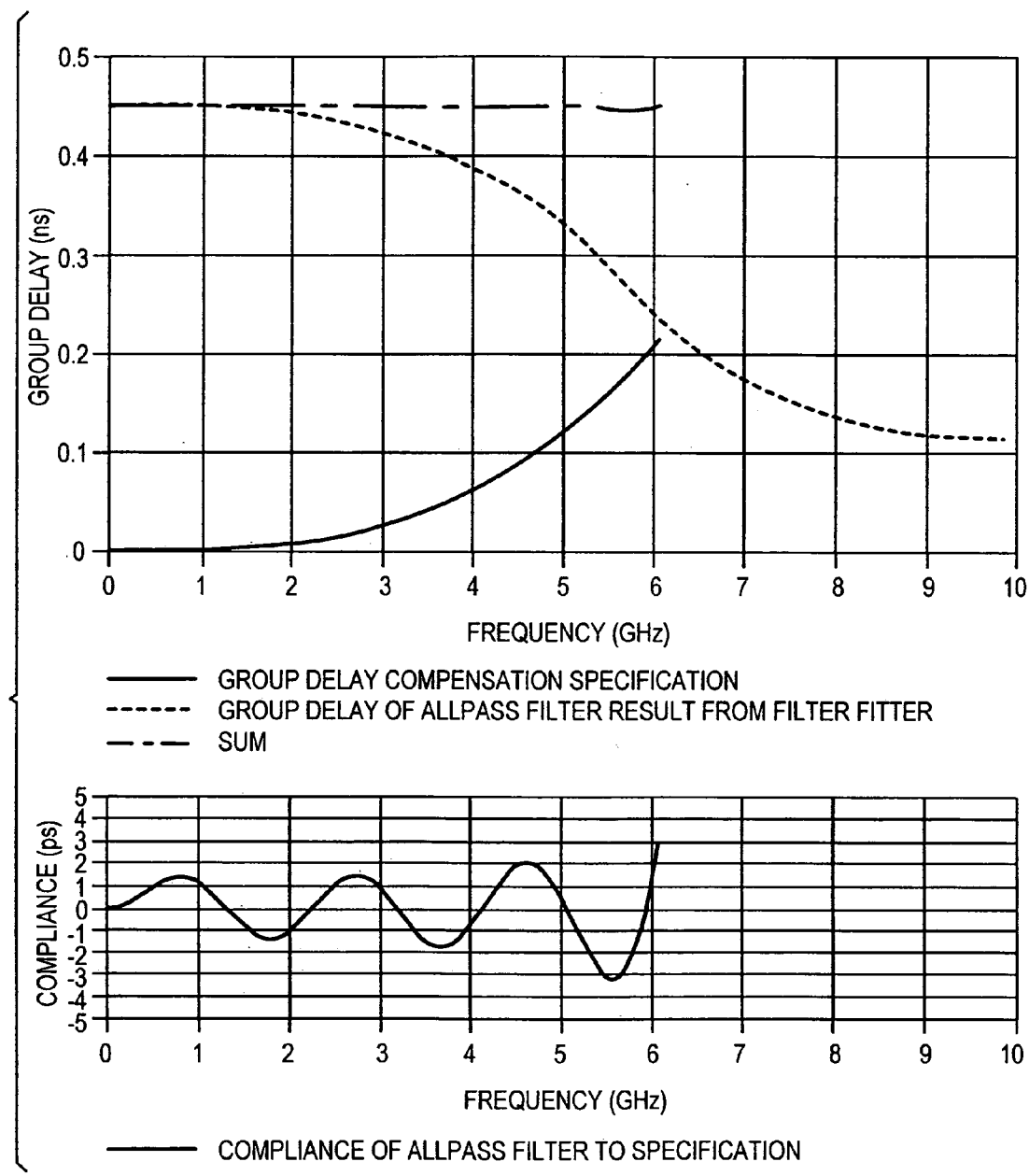
FIG. 11 shows the result of the allpass filter fitter and demonstrates its compliance to a group delay compensation specification.

FIG. 11 shows the result of an allpass filter fit to a group delay compensation specification provided. FIG. 11 demonstrates that the allpass filter is designed such that the sum of the allpass filter group delay and the group delay compensation specification is approximately a straight line. FIG. 11 also shows that the allpass filter complies well with the specification with a maximum error of about +/−3 picoseconds.

What is now needed is an evaluation of the performance of this filter.

To begin evaluation, the allpass filter generated is installed in a polyphase arrangement. This polyphase arrangement is necessary because the allpass filter is generally designed to sample at a sample rate below that which has been used to sample the uncompensated channel response. For example, as mentioned, in the 8600A, the uncompensated channel response has been generated at 200 GS/s. The single-shot sample rate of the system is 20 GS/s. This means that the allpass filter generated cannot directly sample the uncompensated channel response. A simple approach is to simply decimate the uncompensated channel response, but this would cause loss of information. Furthermore, the filtered result of sampling the decimated uncompensated channel response does not provide adequate information for evaluating the filter performance.

For this reason, instead of simple decimation, a downsampler is utilized that produces multi-phase outputs. The number of phases provided by the downsampler is equal to the decimation factor. Each phase is passed through an identical replica of the allpass filter (i.e. an allpass filter element with the same coefficient values, but separate internal delay-line storage). The result of each filter is interleaved through a similar upsampler arrangement. The final result is that of filtering the uncompensated channel response with the allpass filter designed whereby the sample rate of the uncompensated channel response has been preserved.

When the use of magnitude compensation digital filters are also employed on the channel, the magnitude compensation filter is cascaded with the allpass filter under evaluation in the polyphase arrangement.

The result of performing this operation is the compensated channel response. In other words, the output of the upsampler provides the channel response compensated by the allpass filter. It is at this point in the discussion whether this allpass filter is optimally compensating the channel.

Because of the use of this polyphase filter arrangement, some care must be taken. First, the uncompensated channel response must be lowpass filtered to minimize any aliasing possibilities. This is performed by applying a sharp cutoff filter at the Nyquist rate of the allpass filter. Furthermore, if the uncompensated channel response sample rate is not an integer multiple of the allpass filter sample rate, the response needs further to be resampled at an integer multiple sample rate utilizing an interpolating filter. For example, if the uncompensated channel response has been sampled at 200 GS/s and the allpass filter element is sampling at 20 GS/s, the lowpass filter would be designed to pass as best as possible all frequencies up to 10 GS/s and reject all frequencies above 10 GS/s. This is not problematic since the allpass filter should be sufficiently sampling its channel anyway. In the case of the 8600A, the system bandwidth is 6 GHz and the input is quite attenuated at 7 GHz. This allows, the lowpass filter to begin its cutoff at around 7 GHz, providing a 3 GHz transition band for the filter to achieve good attenuation.

The design of anti-aliasing and interpolating filters of this sort are well known to those skilled in the art.

Another element of care that must be taken is that of filter startup. All filters require some amount of samples over which their outputs need to stabilize due to the fact that the filter has not been sampling the input signal for all time. The amount of time required is based on the length of the impulse response of the allpass filter. Since the allpass filter shown (without loss of generality) is an infinite impulse response (IIR) filter element, a decision must be made to determine the startup time. Generally, one uses the number of samples required for the step response to reach 99% of its final value. In this description, the uncompensated channel response acquired has been chosen such that it is 5 ns in duration, and the edge occurs at the 2.5 ns point, the points preceding the edge are all the same. By subtracting out the baseline of the step, 2.5 ns worth of zero valued points are generated (500 zero valued points). This means that as long as the allpass filter impulse response length is less than 50 points for a 20 GS/s filter, that no special care is needed apart from normalizing the uncompensated channel response by subtracting out the baseline.

At this point, the compensated channel response for the allpass filter designed have been determined. To begin evaluating its performance, measurements are taken on this compensated response. For the 8600A, the vital measurements are risetime, overshoot and preshoot. Risetime and overshoot are measured in accordance with accepted standards. While standards provide qualitative definitions of preshoot, they do not dictate a method for quantitative measurement. Therefore, the preshoot measurement utilizes a custom algorithm that is described here.

Figure 12:
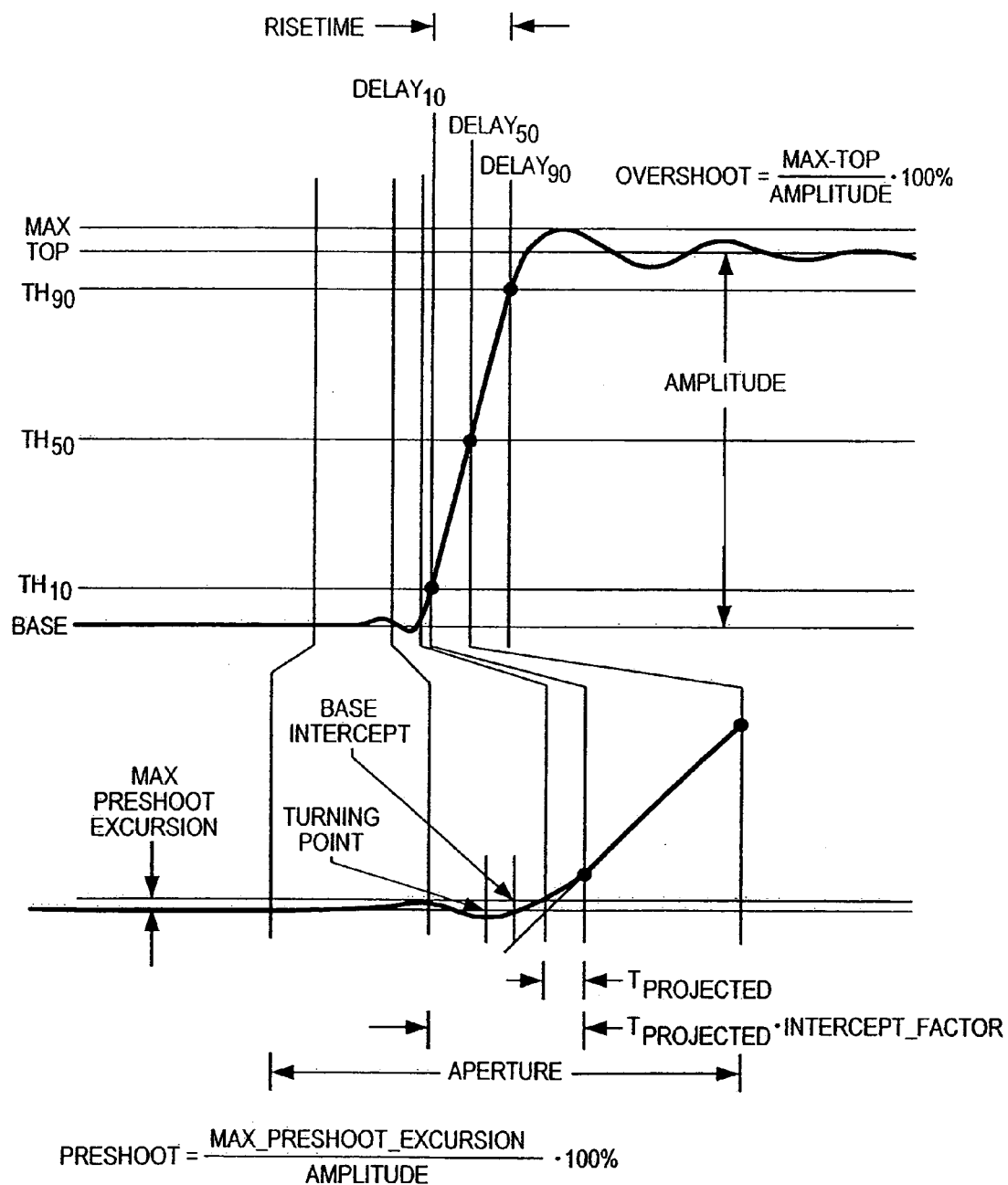
FIG. 12 is used in conjunction with the text to explain how risetime, overshoot, and preshoot are measured.

The reader is directed to FIG. 12 where all three measurement definitions are shown. The preshoot measurement requires additional explanation.

Preshoot is calculated based on the absolute maximum preshoot excursion from the base during the time between the start and end time of the measurement. The end time is the 50% delay point. The start time is the end time minus the aperture. The preshoot excursion is only considered after, walking backwards in time from the 50% delay point, at least one of the following conditions has been met.

1. The value of a waveform point touches or goes below the base.
2. The value of a waveform point is greater than the minimum calculated up to that point (i.e. between that point and the 50% threshold crossing) by an amount greater than the hysteresis value. (i.e. the waveform has "turned").
3. The time of a waveform point is less than or equal to an amount equal to the 50% delay time minus an intercept factor multiplied by the time between the projected intercept time and the 10% delay time. The projected intercept time is found by calculating the time at which a straight line drawn between the 10% and 90% threshold crossings intercepts the base. The configuration of aperture 99, hysteresis 98, and intercept factor 100 are shown in the dialog in FIG. 8 in the dialog area for preshoot measurement settings 97.

It is desired that the risetime, overshoot and preshoot are optimum. The statement of optimum is subjective and is based on the desired final system characteristics. The subjective nature of this optimization is resolved by a grading system. The role of the grading system is to provide an overall score of performance based on the parameter measurements provided. This is accomplished through a function:

$$\text{Score}=F(\text{risetime, overshoot, preshoot}) \qquad \text{Equation 30}$$

Equation 30 presents a difficult situation. Often, the relationship of the measured parameters on the score is not an easy one to define. For that reason, a fuzzy logic grading system is employed.

The use of fuzzy logic is well known to those practiced in the state of the art of control and optimization. I will attempt to limit the discussion here to the pertinent information required to practice the present invention.

The fuzzy logic grading system requires three elements: membership sets, a rule base and a defuzzification element. The membership sets provide the subjective definitions of what constitutes high, low and medium parameter measurements. Furthermore, the fuzzy nature leads purposely to the duality and incompleteness of membership.

The rule base provides the subjective statements of what kinds of grades are associated with the membership of the parameter measurements in their respective sets.

The defuzzification element takes the results of all of the applied rules to resolve a final, single score.

Because of the subjective nature, the membership sets and rule base are configurable. This feature allows the entire optimization system to be built early, with late determination of the subjective elements. Furthermore, it enables easy tradeoffs in performance by simply altering this configuration.

Figure 8:
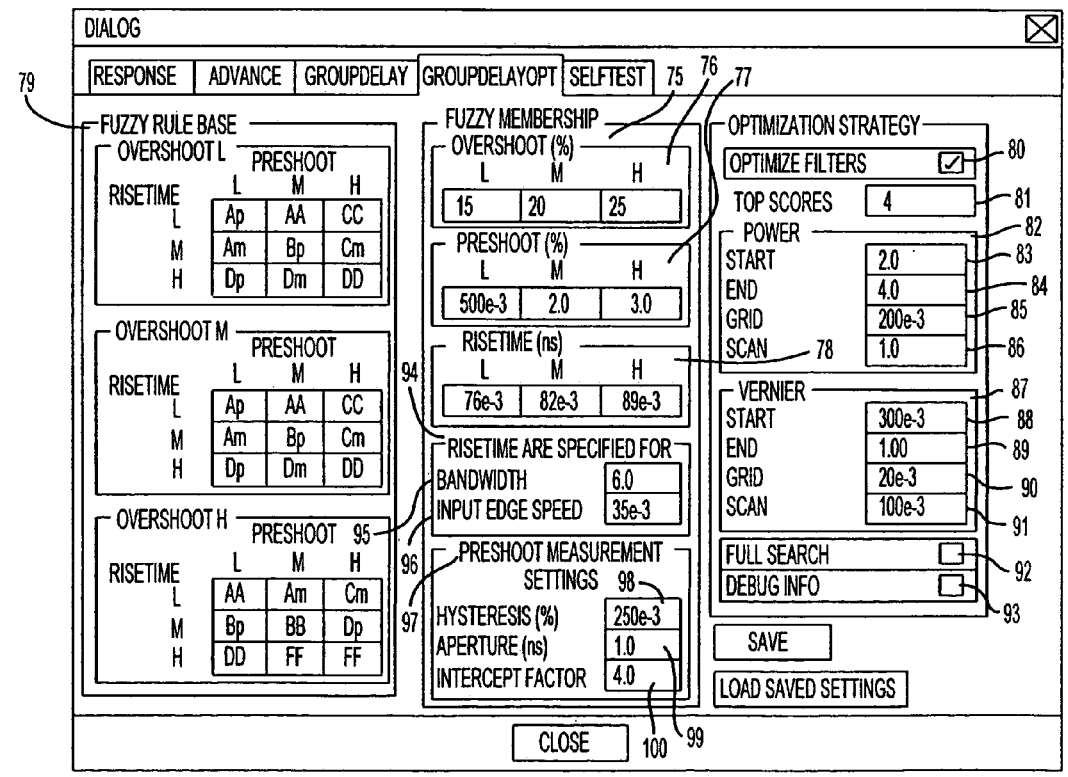

The grading system configuration is shown in FIG. 8. The configurable aspects are shown as the fuzzy membership sets 75 and the fuzzy rule base 79.

Figure 13:
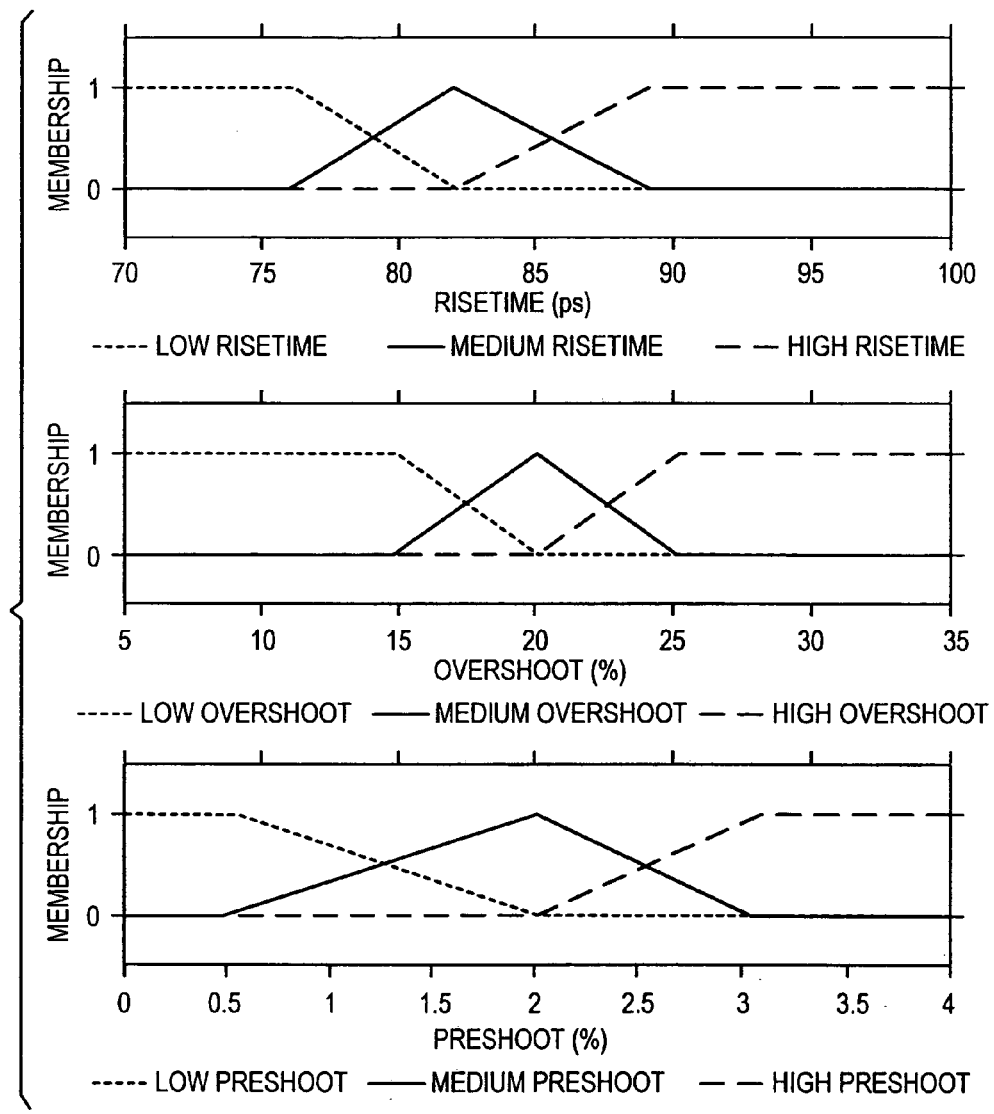
FIG. 13 shows fuzzy membership sets used in a fuzzy logic grading system.

The membership sets 75 define memberships for the three measurement parameters: risetime 78, overshoot 76 and preshoot 77 in three sets: low (L), medium (M) and high (H). These definitions lead to piece-wise linear membership functions as shown in FIG. 13.

During evaluation, the degree of membership of the measurement parameters in the sets is determined, but the risetime membership requires special treatment. The risetime membership set must account for the nonzero risetime of the desired stimulus and for the system bandwidth. The parameters used to make this adjustment are shown in 94 and are used in conjunction with the known system bandwidth and the known actual risetime of the desired stimulus to make an adjustment to the risetime membership definition 78. This is performed as follows:

1. The internal risetimes are calculated by subtracting the risetime in 94 in quadrature from the risetimes in 78 using the relationship shown in Equation 2. For the numbers shown in FIG. 8, the internal risetimes are 67.46, 74.16, and 81.83 ps for low, medium and high internal risetime, respectively.
2. These risetimes are multiplied by the bandwidth specified in 94 to define the bandwidth risetime multipliers. For the numbers shown in FIG. 8, the multipliers are 0.405, 0.445 and 0.491, respectively.
3. These multipliers are divided by the known system bandwidth to form the internal risetimes appropriate for this bandwidth. Since in this case, the known system bandwidth is the same as that specified in 94, we arrive back at the internal risetimes specified in step 1.
4. The internal risetimes calculated in step 3 are added to the risetime of the ideal stimulus in quadrature using the relationship in Equation 2. The risetime of the ideal stimulus is 50 ps, so the new risetimes used in the membership determination are 83.97, 89.44 and 95.23 ps for low, medium and high risetime, respectively.

Once membership has been determined, the rules are executed. Typically, there is one rule for every combination of set memberships. In this case, there are three measurement parameters with three sets (L, M, and H) for a total of $3^3$ or 27 combinations. 79 shows these 27 rules. The rules assign a grade based on memberships. The grades are typical school letter grades. They are denoted by a letter grade (A, B, C, D, and F) followed by a modifier (p for plus and m for minus). When the letter grade is duplicated in the modifier field, the grade is unmodified. So, for example Ap, Cm, and DD refer to the grades A+, C− and D respectively.

Each rule is executed in the table. One rule, for example, is: if (overshoot IS low) AND (risetime IS medium) AND (preshoot IS high) then grade is C−. The evaluation of IS means the degree of membership. For example, the evaluation of overshoot IS low is simply the degree of membership of overshoot in the overshoot low set. Furthermore, the evaluation of AND is defined in fuzzy logic as the minimum of two values: A AND B=min(A,B). Finally, whenever the same grade is present in multiple rules, the values are logically ORed together, where the evaluation of OR is defined in fuzzy logic as the maximum of two values: A OR B=max(A,B).

At the completion of rule execution, there will be a number between 0 and 1 assigned to each of the possible letter grades (F, D−, D, D+, C−, C, C+, B−, B, B+, A−, A, A+). These results must be combined into a single value. This step is called defuzzification.

Since a school grading system is utilized, there is no configuration of the grades provided—they are hardcoded internally. The following numeric values are assigned to the grades:

TABLE 1

| Letter Grade | Numeric Grade |
|---|---|
| A+ | 100 |
| A | 96 |
| A− | 93 |
| B+ | 88 |
| B | 85 |
| B− | 82 |
| C+ | 78 |
| C | 75 |
| C− | 72 |
| D+ | 68 |
| D | 65 |
| D− | 62 |
| F | 0 |

Defuzzification is accomplished by calculating the centroid, or weighted average of the results. This is accomplished by summing up the numbers assigned to each letter grade multiplied by the numeric grade and dividing by the sum of all of the numbers assigned to each letter grade.

For example, if the result of rule execution was C=0.2, B=0.8 and A=0.4, the final result would be:

$$\frac{0.2 \cdot 75 + 0.8 \cdot 85 + 0.4 \cdot 96}{0.2 + 0.8 + 0.4} = 86.71$$

With the calculation of a score, the closed loop has been completed from the output of the optimization element back to the input of this element. In other words, it can be seen that the optimization system can produce values that control the group delay specification, and therefore the allpass filter coefficients, and obtain a score of the performance of the compensated system as a function of the control variables.

The method of optimization will be described: That of finding the set of output control variables that maximize the score.

The optimizer element reads the optimization strategy from disk. The optimization strategy 80 is configurable and is shown in the dialog in FIG. 8. The optimization configuration for the power 82 and vernier 87 are shown. The configuration for power 82 includes the start 83, end 84, grid 85 and scan 86. Similarly, the configuration for vernier 87 includes start 88, end 89, grid 90 and scan 91. In this system, the start, end, and grid settings for each parameter define the possible state-space of the power/vernier settings. The start and end provide bounds on the parameters, the grid specifies the granularity. For example, for the power settings shown in 82, there are 11 possible powers from 2 to 4 with an increment of 0.2. For the vernier settings shown in 87, there are 36 possibilities for a total of 396 total power/vernier possibilities.

The optimization is accomplished by first sweeping an initial scan grid. The scan grid is defined by the same start and end parameters, but the granularity is based on the scan values. For the parameters provided in 82, the power scan grid consists of 1, 2 and 3. For the parameters provided in 87, the vernier scan grid consists of 0.3, 0.4, 0.5, 0.6, 0.7, 0.8, 0.9 and 1.0. For this configuration, there are 24 scan grid elements.

During the initial scan, all scan grid elements are evaluated and the grid elements with the top scores are retained for closer examination. The tradeoff between the degree of reliability and the amount of work required for the remainder of the optimization depends on the number of top scores retained. The configuration of the top scores retained is shown in 81. For this case, the number of top scores retained is four.

Figure 14:
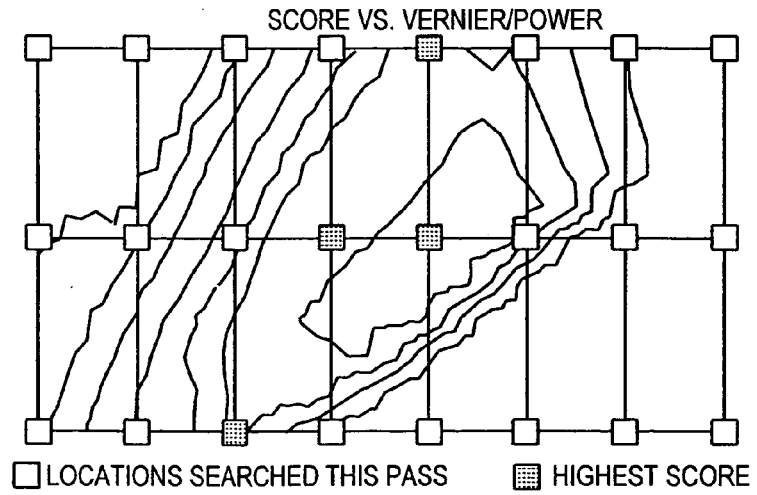
FIG. 14, FIG. 15, FIG. 16, and FIG. 17 describe the steps used in performance optimization.

The result of the initial scan is shown pictorially in FIG. 14, where the initial scan grid and the resulting four top scores can be clearly seen. FIG. 14 is shown with the actual scores overlaid to aid in clarity.

Figure 15:
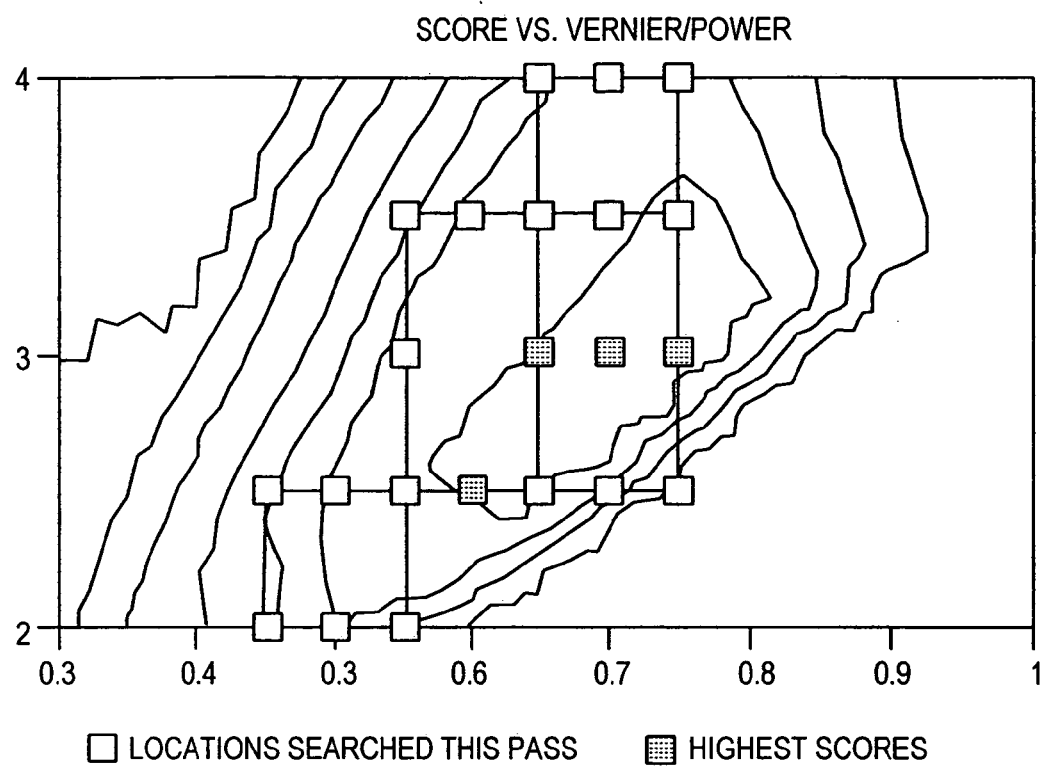

To execute the next scan, the granularity of both the power and vernier scan grid is halved and the eight locations forming a square about the top scores are scanned. Once again, the top scores are retained. Note that the top scores retained are the top scores for all scans. This is shown in FIG. 15.

Figure 16:
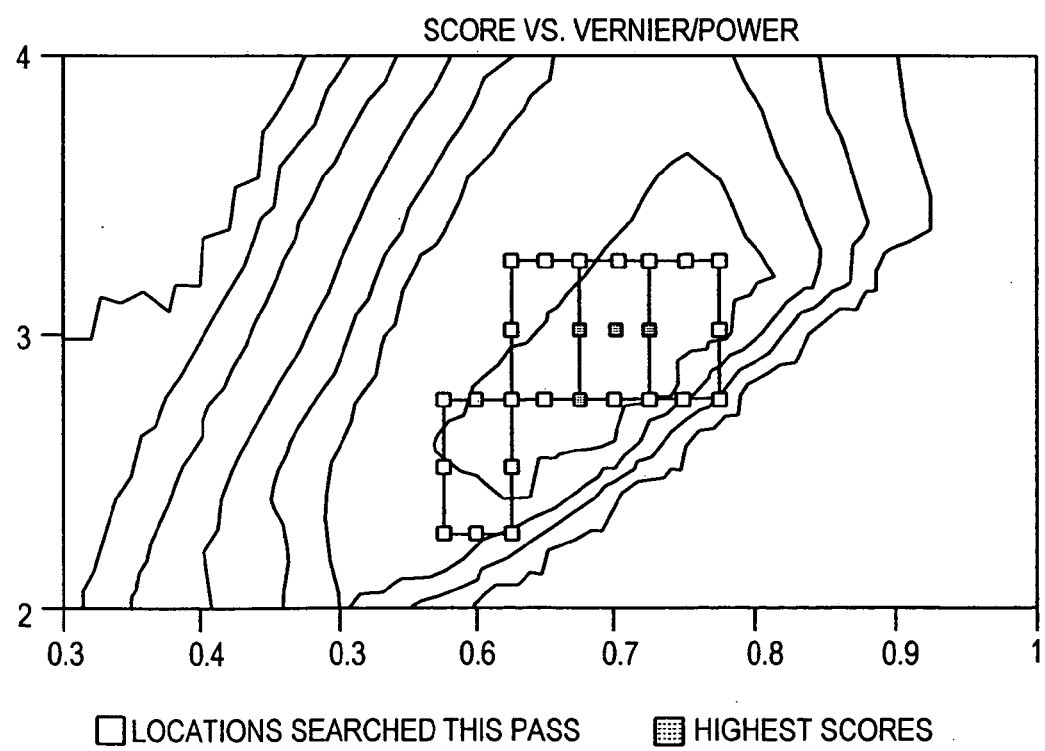
Figure 17:
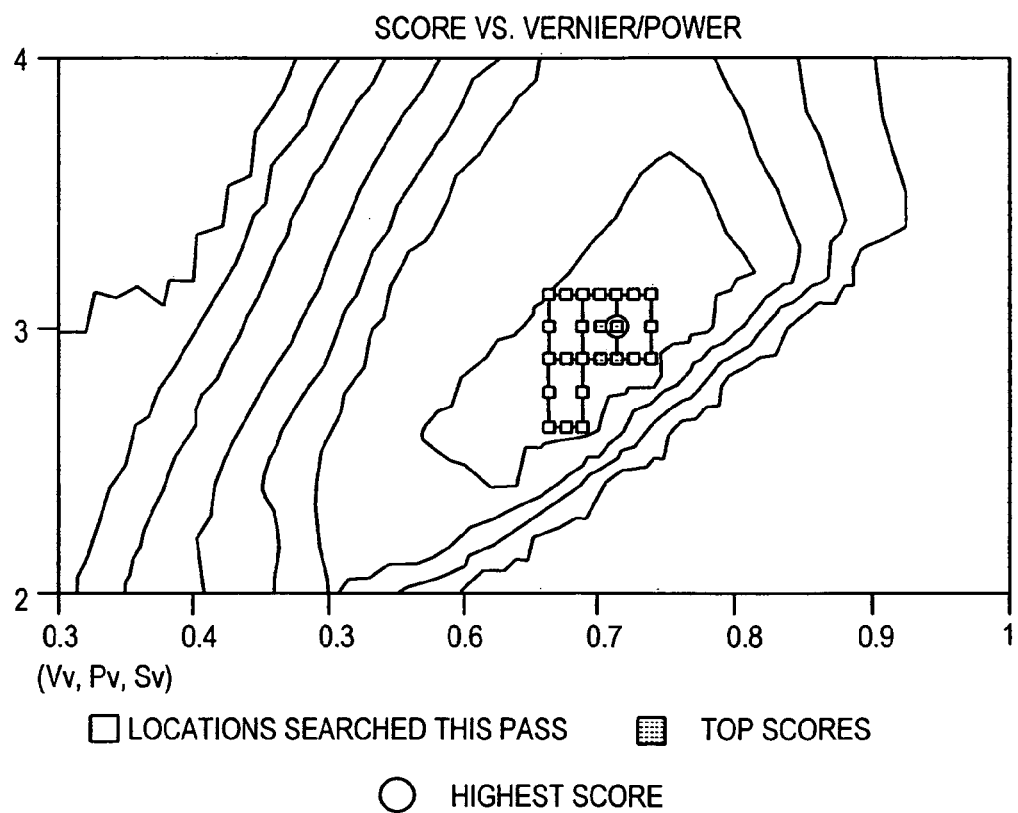

Scanning continues in the same manner (this is shown in FIG. 16 and FIG. 17) until both the power and vernier scan grid drops below the grid sizes specified in 85 and 90. Note that during the scan, if one of the parameters scan grids drops below these grid specifications, it is not further decreased, and the search square becomes a search line about the remaining parameter.

Note that this process could be extended to a multiple variables where the squares about the top scores become hypercubes.

Upon completion of the search, the element with the highest score wins out.

Alternatively, especially for debugging purposes, the entire grid can be scanned to generate a complete surface of score vs. control variable settings, and the results of the entire search can be dumped to disk for further examination. These controls are shown in 92 and 93.

It is important to check that neither of the output control variables has railed at its start or end limits. Railing indicates that the search area was inadequate. In such a case, a warning is generated or a widening of the search area is employed.

It is noteworthy that other optimization strategies could be employed and are viewed as obvious enhancements to this invention. This embodiment demonstrates an algorithmic search. While seemingly attractive, gradient methods were avoided because score vs. control variable surfaces were observed with the following characteristics:

1. Some had multiple local maxima.
2. Some had maximums that could not be reached by following a gradient.
3. All had flat areas with zero gradients.
4. Second derivatives (derivatives of the gradient) are discontinuous.

These characteristics are based, to a large degree, on the use of a fuzzy logic grading system and further on the use of piece-wise linear membership functions as shown in FIG. 13.

Figure 18:
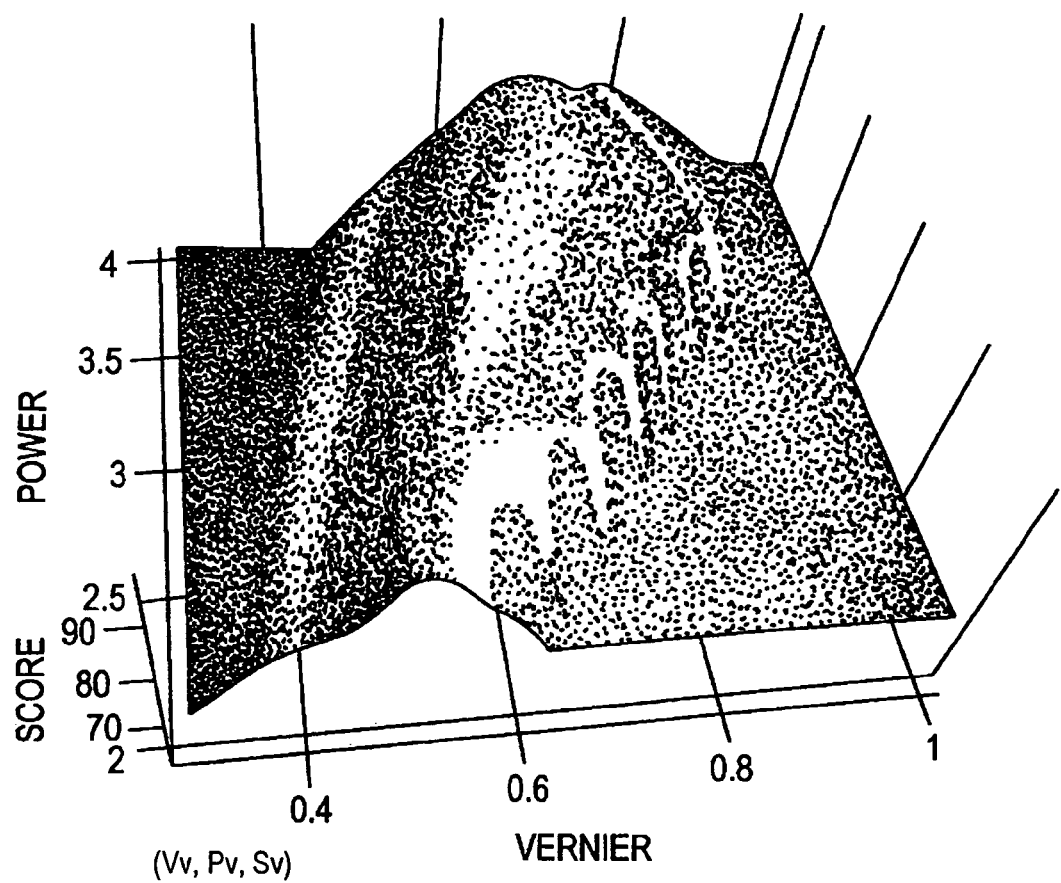
FIG. 18 is a surface plot of the overall system performance score as a function of the optimizer output control variables.

A state-space of score verses control variables for an 8600A channel/gain setting/amplifier configuration is shown in FIG. 18. This was generated by performing a full-search with debug information, as configured in 92 and 93.

Figure 19:
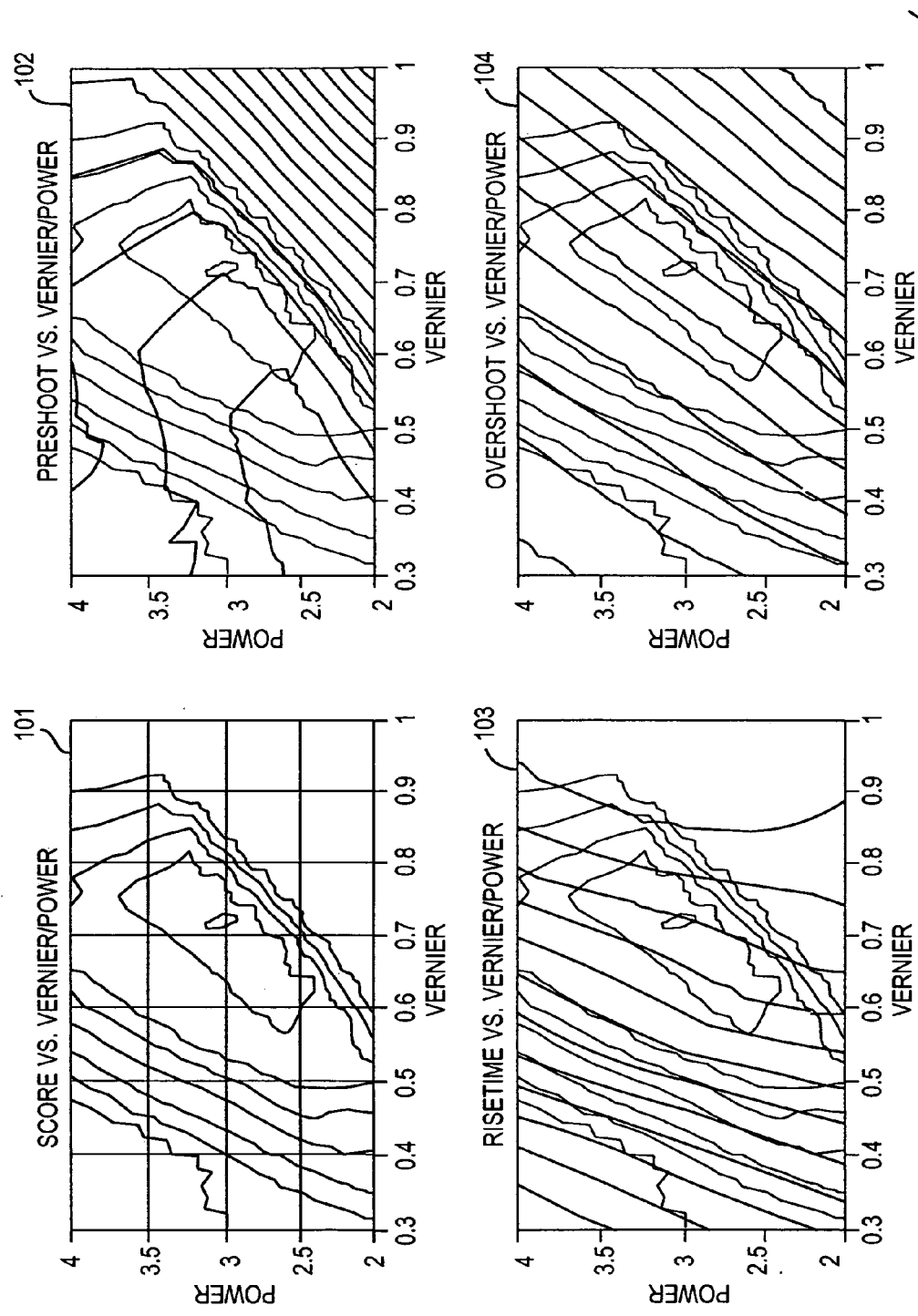
FIG. 19 contains diagrams that demonstrate how the performance optimization balances the specifications for risetime, overshoot, and preshoot.

The score vs. control variable situation is shown topographically in FIG. 19, where four plots are shown. 101 shows a contour plot of FIG. 19. For this case, the optimum score was found to be 97.58 at a vernier value of 0.72 and a power value of 3.0. The vernier value chosen 56 is shown in the dialog in FIG. 7 along with the power chosen 66. FIG. 19 shows three other plots each containing the score overlaid with contour plots of the preshoot vs. control variables 102, the risetime vs. control variables 103 and the overshoot vs. control variables 104. Note that the risetimes graphed are for a 35 ps edge, as specified in 96. These plots illustrate the fact that the optimum settings were arrived at by balancing low risetime vs. high preshoot and overshoot.

The results of the optimization are shown in the dialog in FIG. 7 in the evaluation section 67. The results shown are the actual input edge risetime of the desired stimulus 68, the calculated optimized risetime 69 for the edge speed specified in 96, the overshoot 70 and preshoot 71, the top 72 and base 73 calculation for debugging purposes, and finally, the overall score 74. These results could be presented to a user for performance verification.

When optimization is complete, an allpass filter is built under the optimum conditions found and is utilized by the system to compensate acquisitions on the channel.

Figure 2:
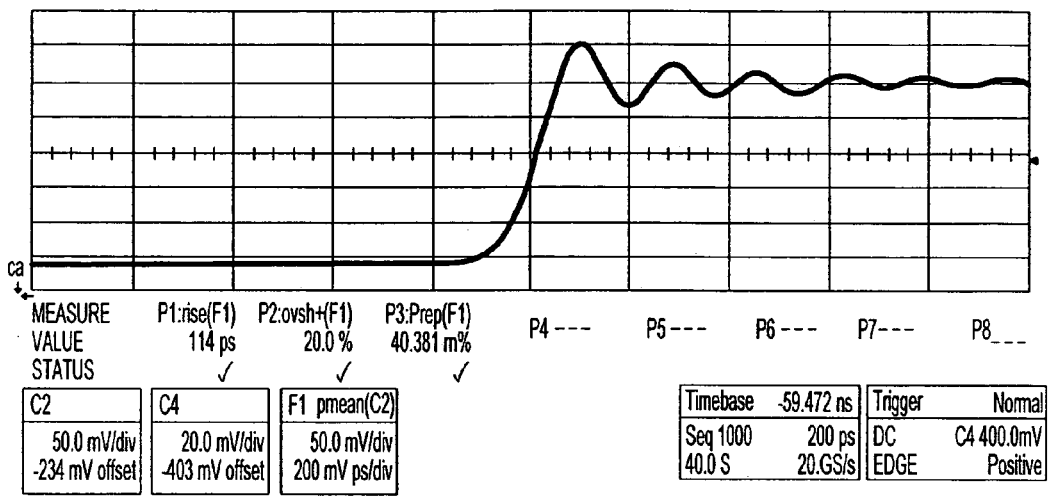
FIG. 2 is the channel step response of a WM8600A DSO with poor group delay characteristics exhibited by the measurements of risetime, overshoot.
Figure 3:
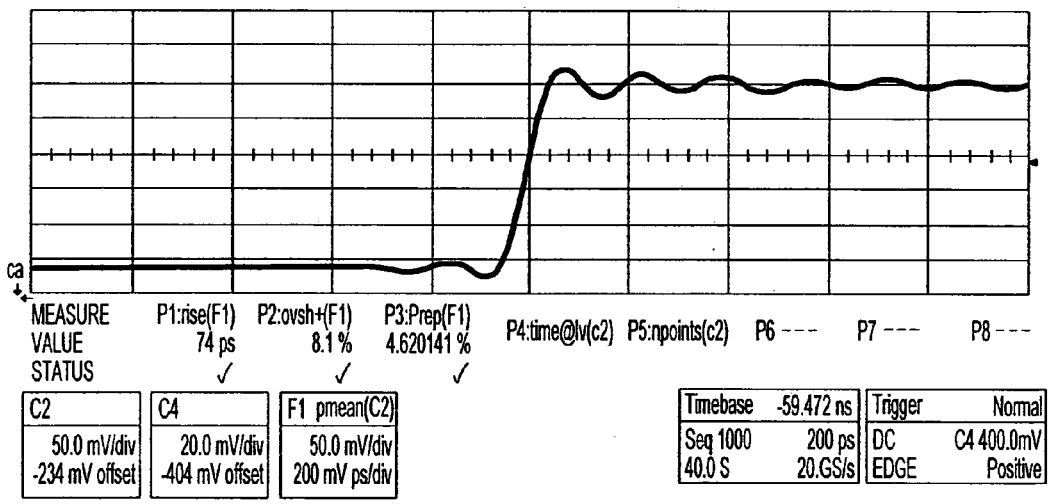
FIG. 3 is this the channel step response of the same DSO whereby the group delay compensation was performed naively and has poor characteristics exhibited by the measurement of preshoot.
Figure 4:
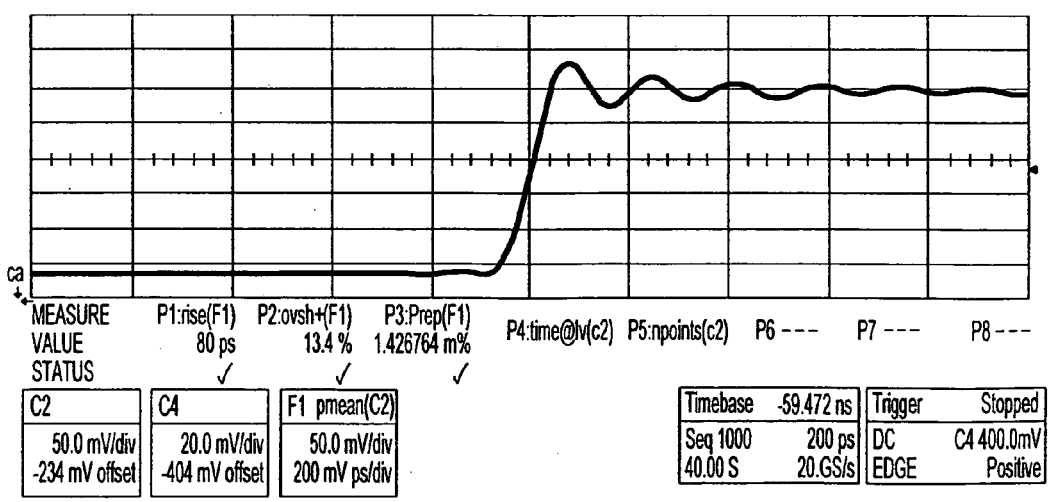
FIG. 4 is the channel step response of the same DSO whereby the group delay compensation was performed properly exhibited by the measurements of risetime, overshoot and preshoot.
Figure 5:
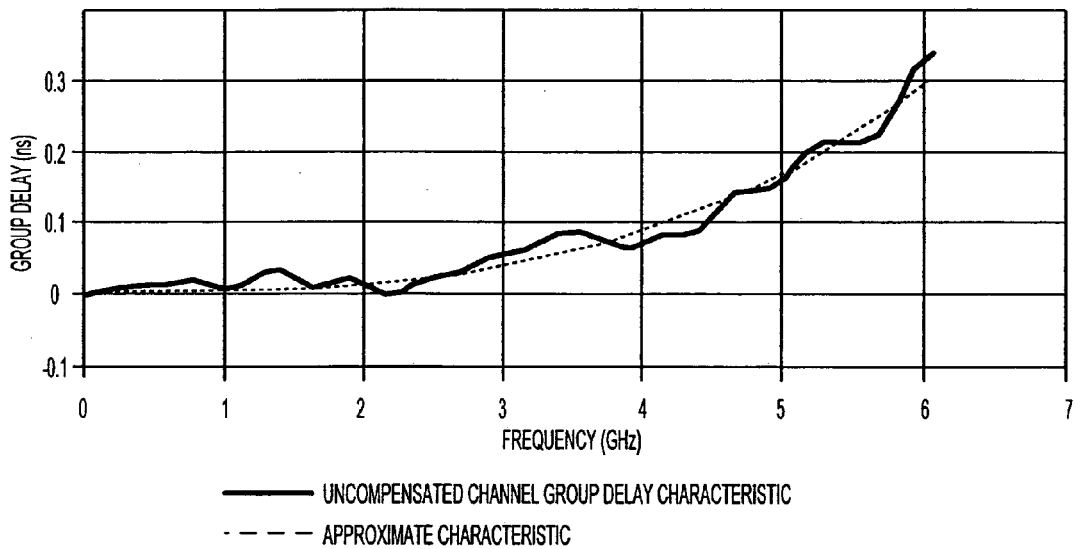
FIG. 5 is the uncompensated channel group delay characteristic as a function of frequency along with a power curve estimation of that characteristic.
Figure 20:
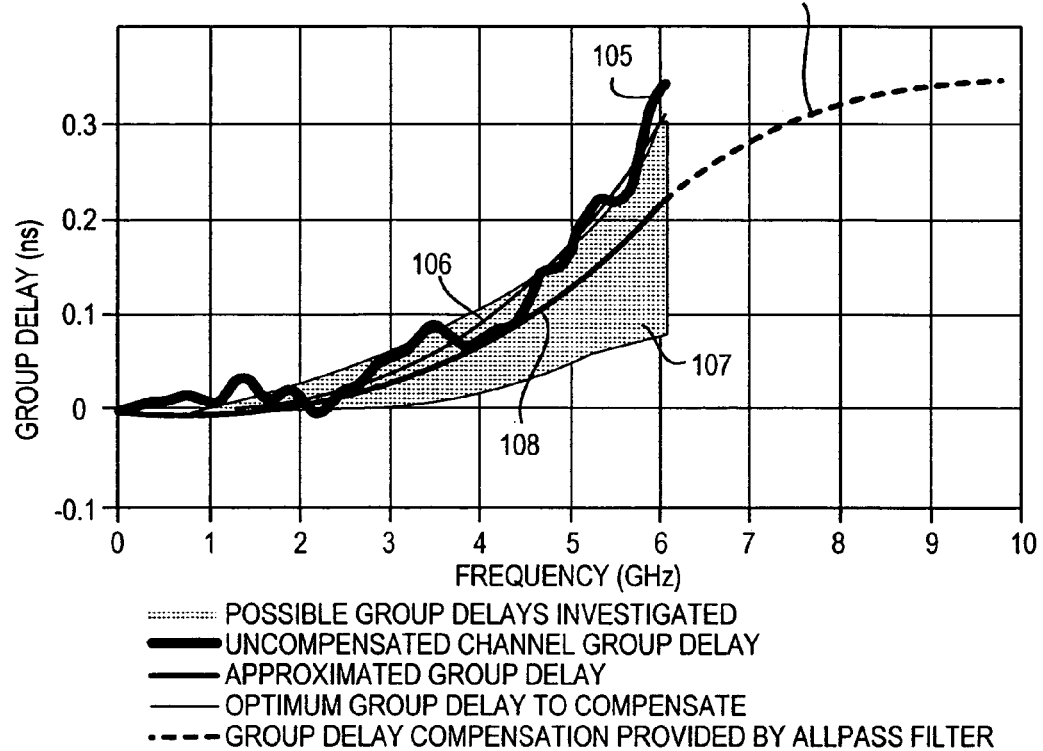
FIG. 20 illustrates the group delay compensation possibilities that were investigated during performance optimization along with the group delay of the uncompensated channel and the group delay compensation chosen.
Figure 21:
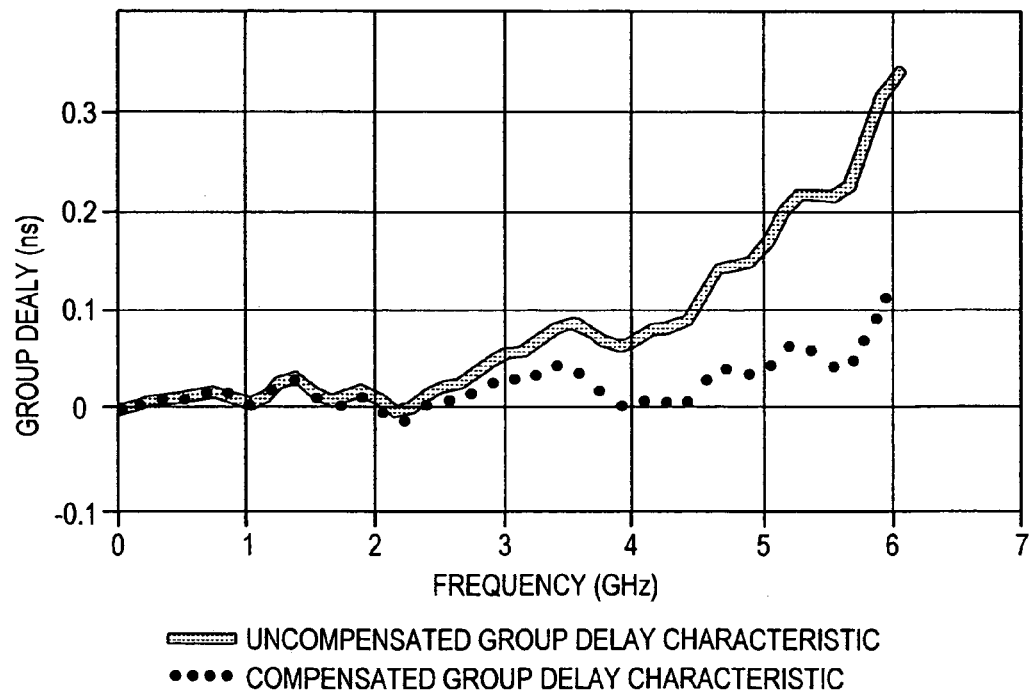
FIG. 21 shows the compensated and uncompensated group delay characteristic for the purpose of illustrating that the system performance cannot be optimized merely by considering the group delay characteristics in isolation.

In FIG. 20, the uncompensated group delay of the channel 105 is shown, along with a power curve estimate of this characteristic 106. The optimizer searched the region denoted by 107, admittedly searching this region with functions limited to those in the form of Equation 6. It is interesting to observe that the final group delay characteristic for compensation chosen is 108. Not only is 108 not very close to 105, it is not even close to 106, which is an approximation of the channel characteristic in exactly the same form as those utilized for the search. As a matter of fact, utilizing the approximate characteristic 106 to compensate the situation in FIG. 2 results in the substandard results shown in FIG. 3 whereas utilizing the compensation provided by the allpass filter 109 to compensate FIG. 2, results in the superior compensation shown in FIG. 4. FIG. 21 shows group delay characteristics of the uncompensated and compensated channel and demonstrates that the optimum group delay characteristic is not one that causes the group delay characteristic to be constant and flat. Furthermore, no amount of examination of the group delay characteristics shown in FIG. 21 provides any clues regarding the optimality of various group delay characteristics on the simultaneous minimization of risetime and preshoot.

The fact is that this invention is capable of optimizing the group delay characteristics of the channel (within certain obvious constraints) without necessarily optimizing the theoretical group delay characteristic.

It will be understood that the above description of the present invention is susceptible to various modifications, changes and adaptations, and the same are intended to be comprehended within the meaning and range of equivalents of the appended claims:

The invention claimed is:

1. A digital group delay compensation system comprising:
a digital allpass filter that is utilized in an implementation phase; and
a system that generates coefficients for the allpass filter used in the implementation phase such that the overall performance of a system is measured and optimized in a calibration phase;
wherein the definition of optimum overall performance of a system is user configurable and based upon a user defined weighting between a measured amount of risetime, overshoot, and preshoot in the system step response.

2. The system according to claim 1 whereby optimum performance is not directly based on phase response or group delay characteristic.

3. A digital group delay compensation system comprising:
a digital allpass filter that is utilized in an implementation phase; and
a system that generates coefficients for the allpass filter used in the implementation phase such that the overall performance of a system is measured and optimized in a calibration phase;
wherein the system that optimizes the performance is a closed loop system comprising: an optimization element whose output are control variables that it adjusts and whose input is a score of overall system performance based on the output control variables whereby this element adjusts its outputs and examines its input in a manner contrived to maximize the input score; a specifications generator that converts the optimizer output and optionally, and the measured uncompensated group delay of the system, into a frequency domain group delay specification; an allpass filter fitter element that converts the frequency domain group delay specification into allpass filter coefficients such that the frequency domain group delay specifications are compensated with a high degree of compliance; a stimulus generator that can be attached to the channel input in a manner enabling the measurement of the response of the uncompensated system to this known stimulus; an allpass filter arrangement containing an allpass filter implementation based on the coefficients provided by the allpass filter fitter element that filters the response of the uncompensated system to a stimulus and produces the response of the compensated system to a stimulus; a measurer that makes various parameter measurements on the response of the compensated system to a stimulus; and a grading system that converts the various parameter measurements to a score of overall compensated system performance.

4. The system according to claim 2 in which, in the calibration phase, the response of the uncompensated system to a stimulus is calculated using an internally generated ideal stimulus and the measured uncompensated channel response characteristics.

5. A digital group delay compensation system comprising:
a digital allpass filter that is utilized in an implementation phase; and
a system that generates coefficients for the allpass filter used in the implementation phase such that the overall performance of a system is measured and optimized in a calibration phase;
whereby optimum performance is not directly based on phase response or group delay characteristic; and
wherein in the calibration phase, the grading system is implemented as a fuzzy logic grading system comprising: user defined fuzzy membership sets for the parameters measurements produced by the measurer; a user defined fuzzy rule base that provides grading rules based on the membership of the parameter measurements in the fuzzy membership sets; and a defuzzification element that produces a single score based on the execution of the rules in the fuzzy rule base.

6. A digital group delay compensation system comprising:
a digital allpass filter that is utilized in an implementation phase; and
a system that generates coefficients for the allpass filter used in the implementation phase such that the overall performance of a system is measured and optimized in a calibration phase;
whereby optimum performance is not directly based on phase response or group delay characteristic; and
wherein in the calibration phase, the allpass filter fitter utilizes the Levenberg-Marquardt algorithm in conjunction with the functions that defines the group delay of allpass filter and the partial derivatives of this function with respect to the filter coefficients and a guess at the coefficient values to calculate filter coefficient values; These coefficient values calculated such that the mean-squared error between a group delay specification provided and the function that defines the group delay of an allpass filter evaluated using said coefficients is minimized.

7. The system according to claim 2 where, in the calibration phase, the response of the uncompensated system to a known stimulus is measured such that the known stimulus passes through additional hardware connected to the channel, such as a probing element, to include the effects of this additional hardware in the compensation.

8. The system according to claim 2 in which, in a calibration phase, the allpass filter arrangement is a polyphase arrangement capable of filtering the response of the uncompensated system to a known stimulus with an allpass filter designed for a different sample rate while preserving the sample rate of the response of the uncompensated system to the known stimulus.

9. The system according to claim 2 whereby the calibration phase is entered periodically allowing dynamic calibration for changing channel response characteristics.

10. The system according to claim 7 whereby the calibration phase is entered periodically allowing dynamic calibration for changing channel response characteristics.

11. The system according to claim 3 whereby the measurements that contribute to the optimization of system performance are provided externally for examination of performance.

12. The system according to claim 10 whereby the measurements that contribute to the optimization of system performance are provided externally for examination of performance.

* * * * *

UNITED STATES PATENT AND TRADEMARK OFFICE
CERTIFICATE OF CORRECTION

| | | |
|---|---|---|
| PATENT NO. | : 7,050,918 B2 | Page 1 of 1 |
| APPLICATION NO. | : 10/678374 | |
| DATED | : May 23, 2006 | |
| INVENTOR(S) | : Peter J. Pupalaikis et al. | |

It is certified that error appears in the above-identified patent and that said Letters Patent is hereby corrected as shown below:

IN THE CLAIMS:

Col. 22, line 34 (Claim 6)  - change "These" to --these--.

Signed and Sealed this

Twenty-ninth Day of August, 2006

JON W. DUDAS
*Director of the United States Patent and Trademark Office*